(12) United States Patent
Kato

(10) Patent No.: US 6,809,360 B2
(45) Date of Patent: Oct. 26, 2004

(54) SEMICONDUCTOR DEVICE AND METHOD OF MANUFACTURING THE SAME

(75) Inventor: Yoshikazu Kato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 90 days.

(21) Appl. No.: 10/315,179

(22) Filed: Dec. 10, 2002

(65) Prior Publication Data
US 2003/0178659 A1 Sep. 25, 2003

(30) Foreign Application Priority Data
Mar. 20, 2002 (JP) .................................. 2002-077714

(51) Int. Cl.$^7$ .............................................. H01L 29/76
(52) U.S. Cl. ...................... 257/295; 257/296; 257/310; 257/532
(58) Field of Search ................... 257/295, 296, 257/303, 306, 310, 528, 532

(56) References Cited

U.S. PATENT DOCUMENTS 5,116,643 A * 5/1992 Miller et al. ............. 427/126.3
6,555,428 B2 * 4/2003 Jung ......................... 438/239
2002/0072223 A1 * 6/2002 Gilbert et al. .............. 438/629
2002/0130345 A1 9/2002 Saigoh et al.

* cited by examiner

Primary Examiner—Tuan H. Nguyen
(74) Attorney, Agent, or Firm—Westerman, Hattori, Daniels & Adrian, LLP

(57) ABSTRACT

There are contained first capacitors each having a first lower electrode, a first ferroelectric film, and a first upper electrode, which are formed sequentially in a first region of an insulating film, and a second capacitor having a second lower electrode, a second ferroelectric film, and a second upper electrode, which are formed sequentially in a second region of the insulating film, wherein the first ferroelectric film is formed of first ferroelectric material that consists of plural types of elements containing a first element, the second ferroelectric film is formed of second ferroelectric material that consists of plural types of elements containing the first element, and a concentration of the first element in the second ferroelectric film is lower than a concentration of the first element in the first ferroelectric film.

7 Claims, 23 Drawing Sheets

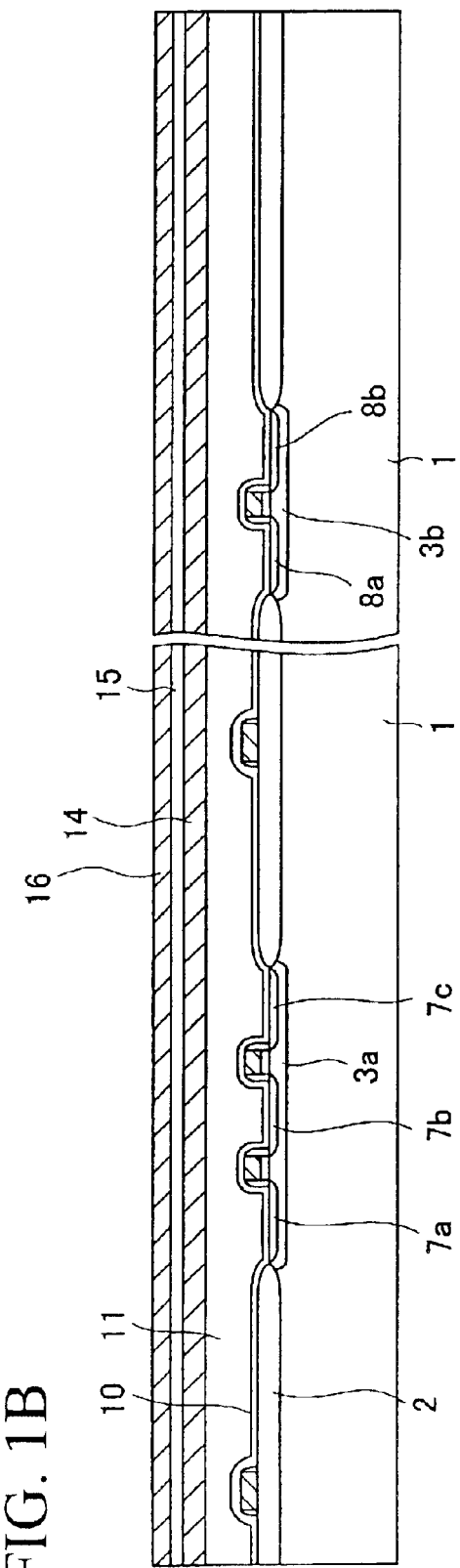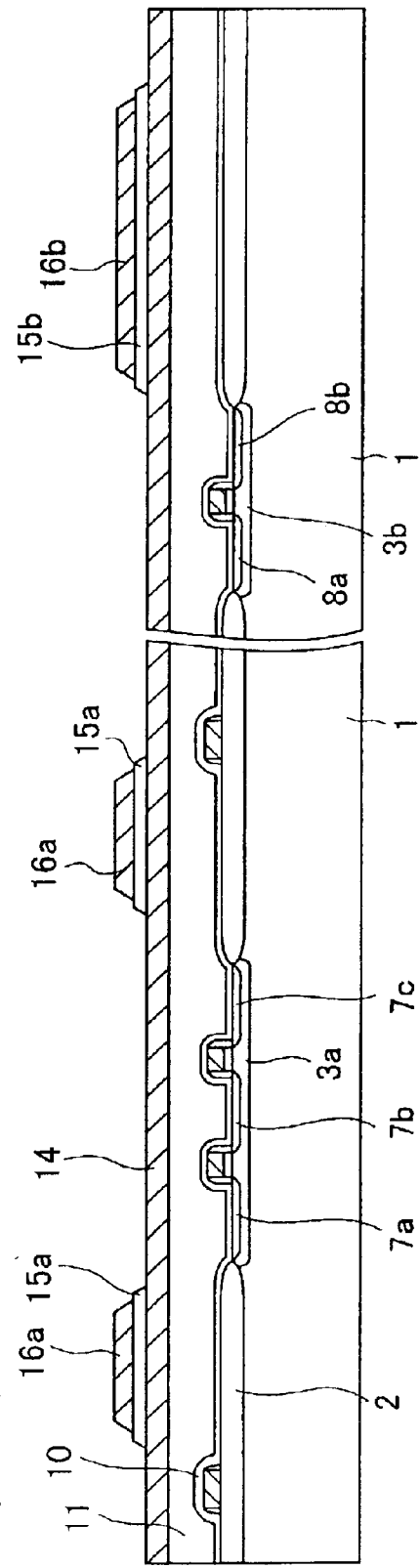

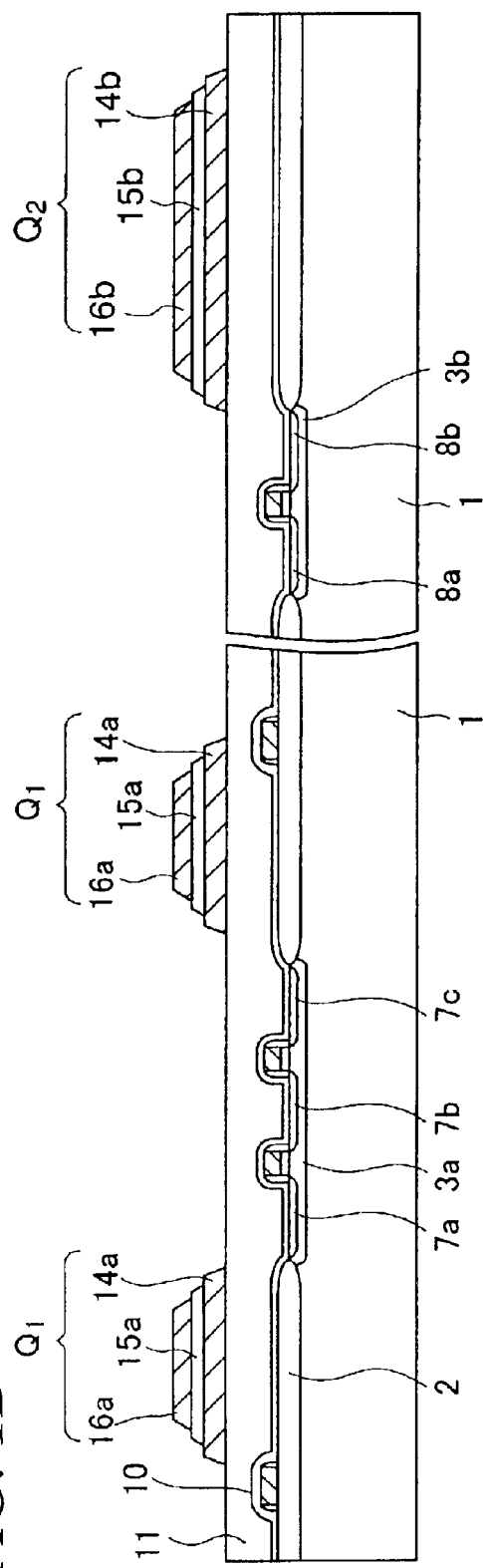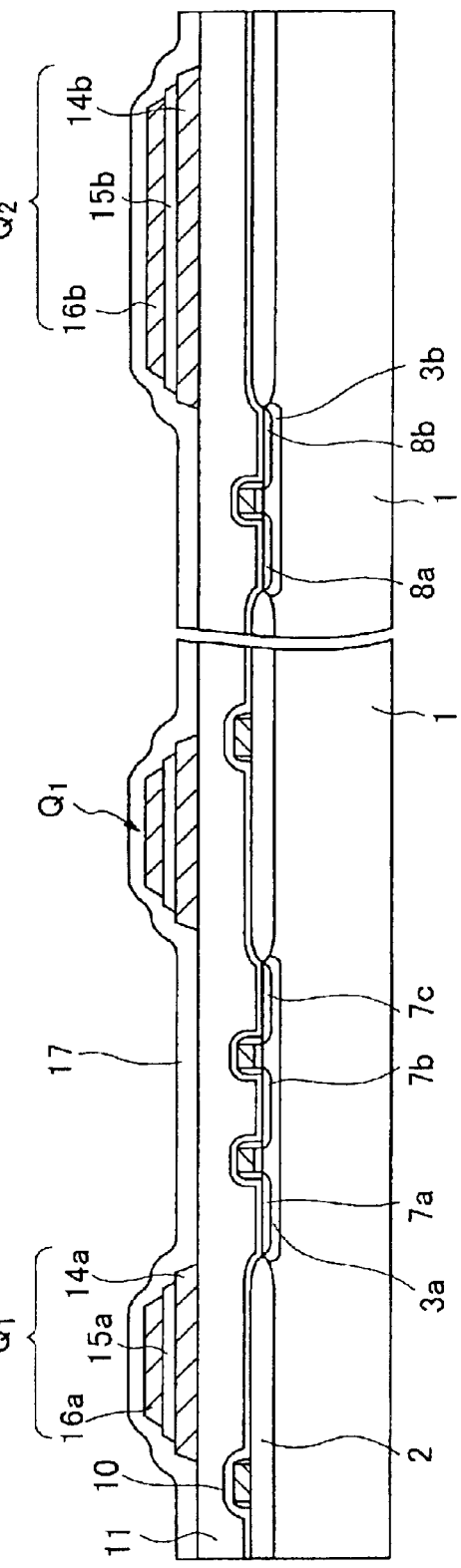

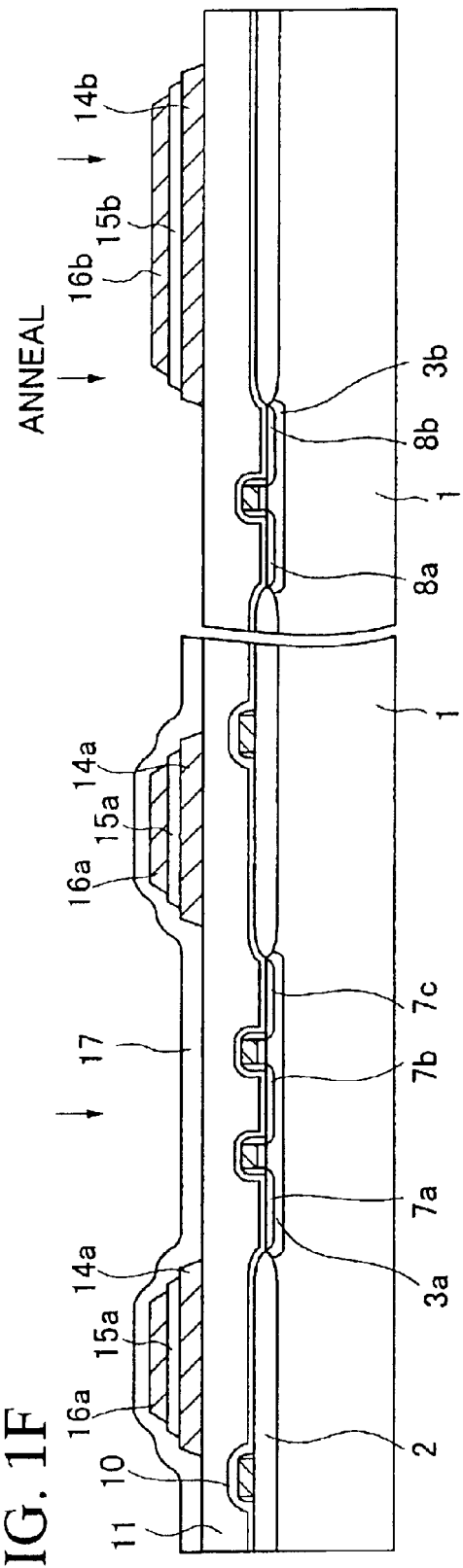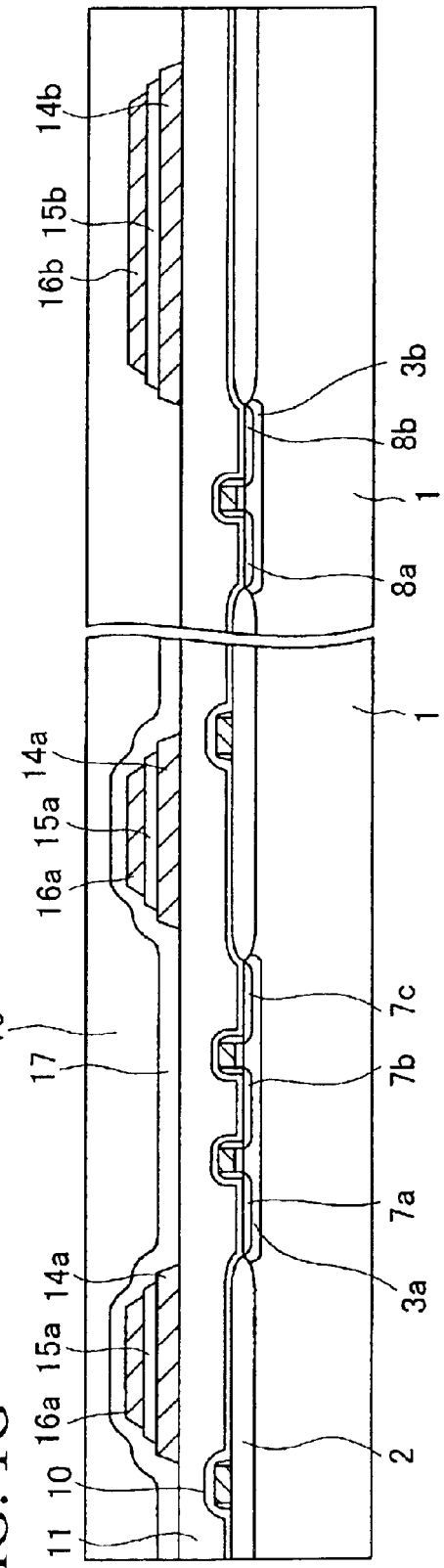

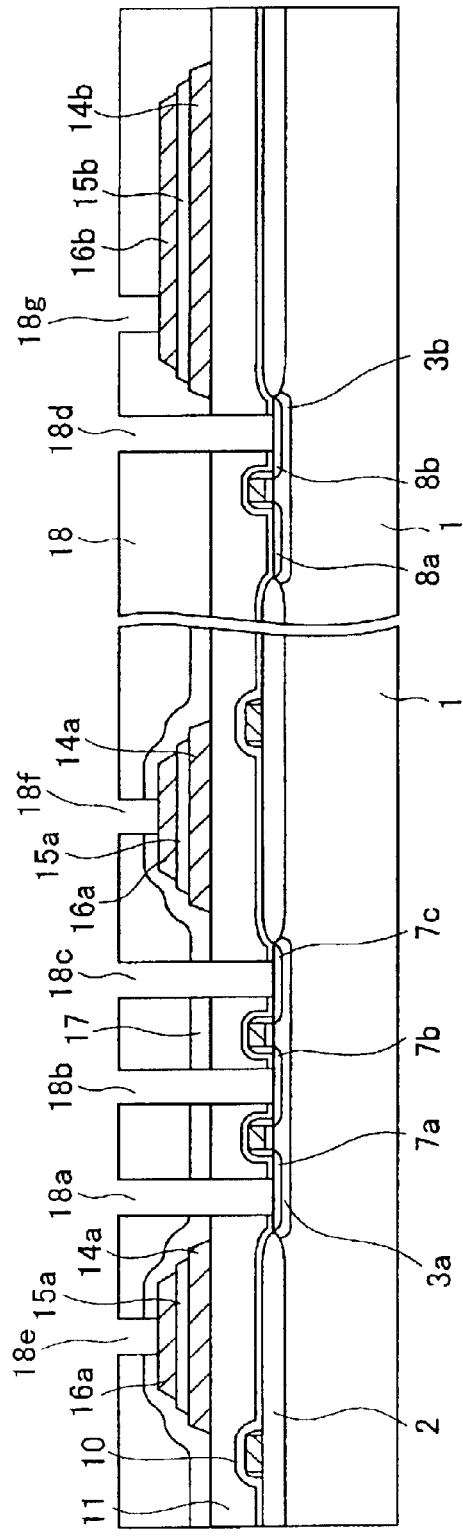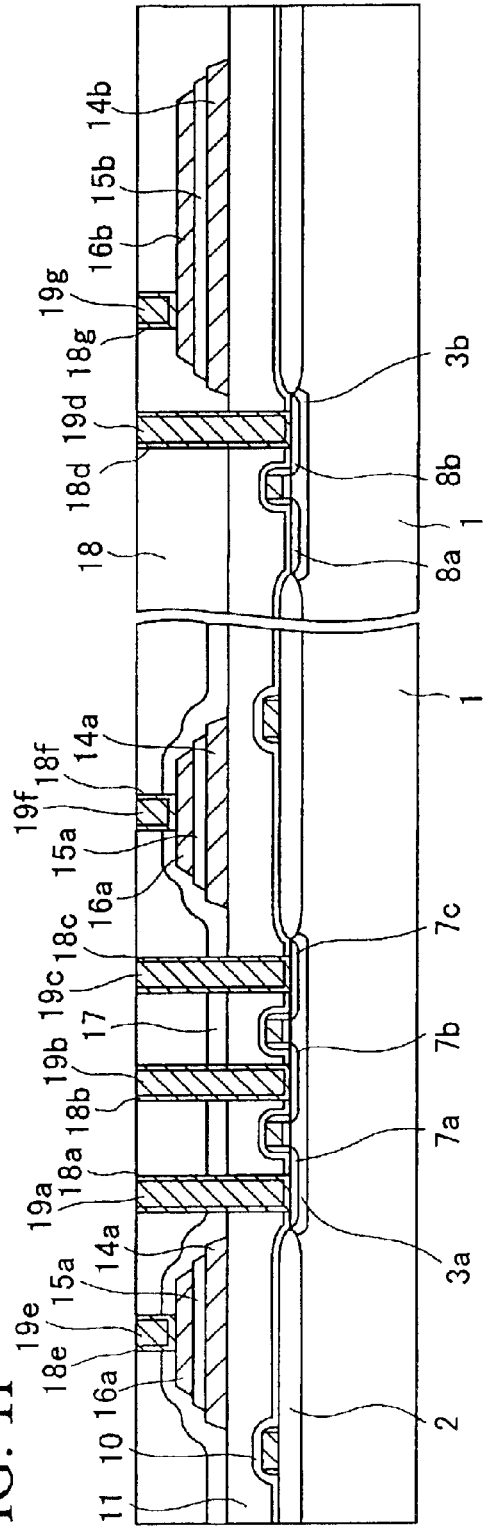

Anneal condition: 650°C 60min

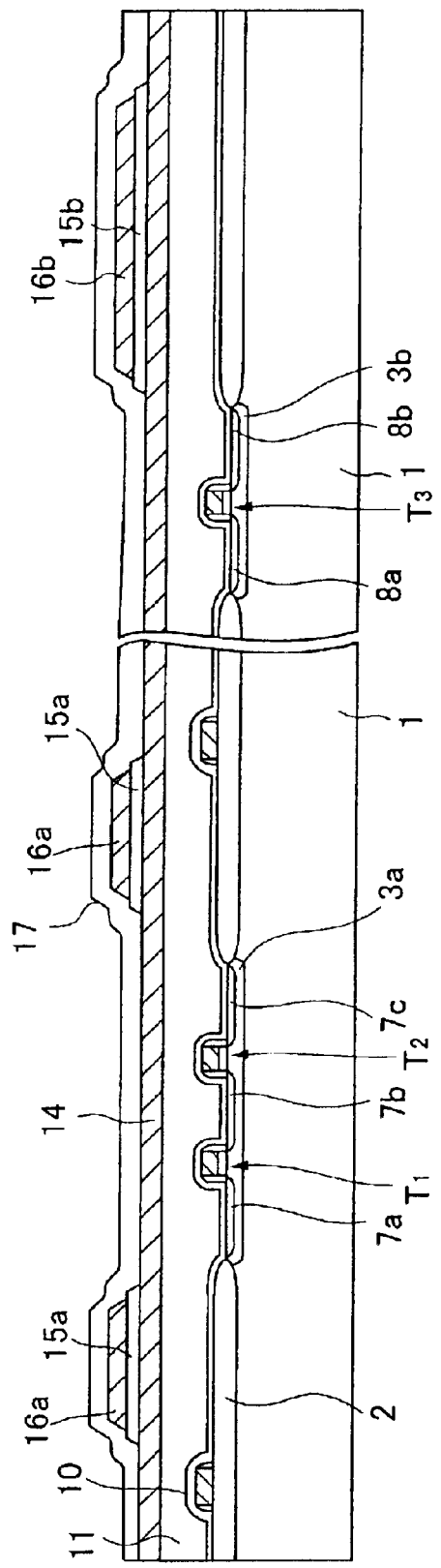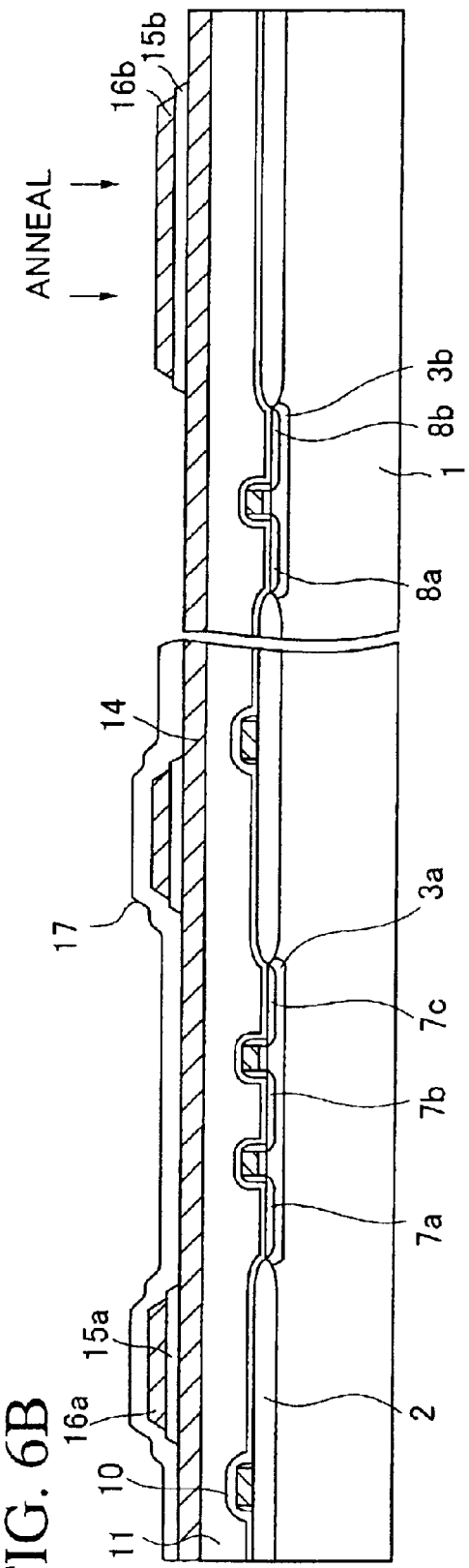

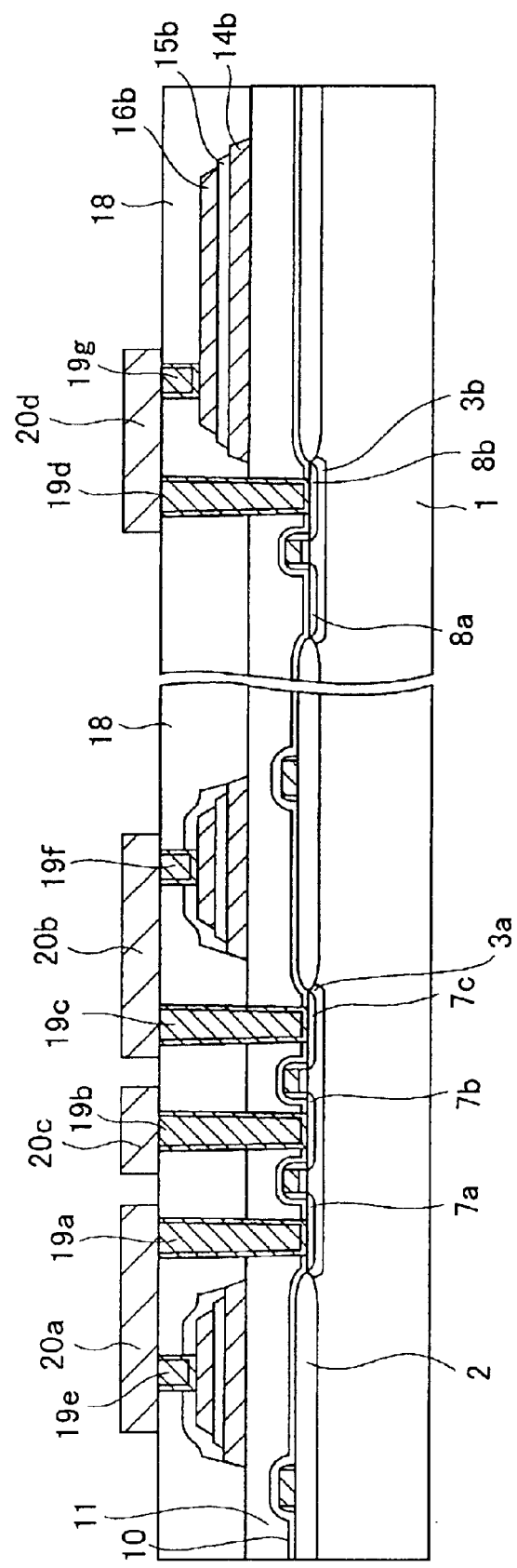

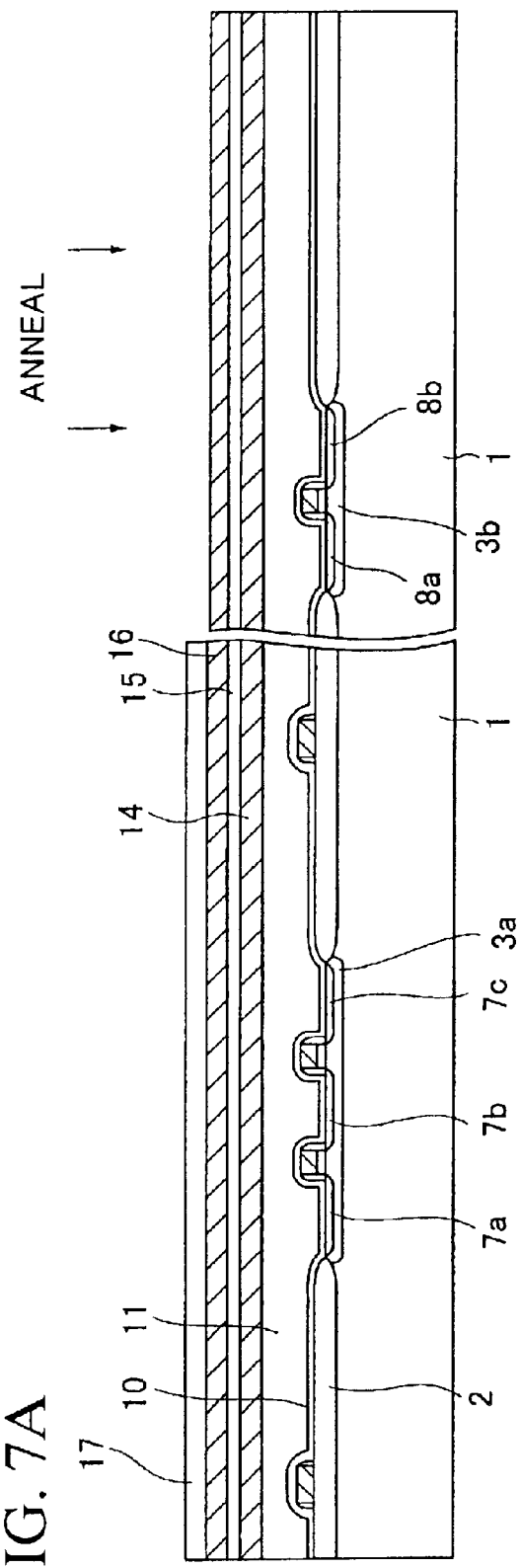
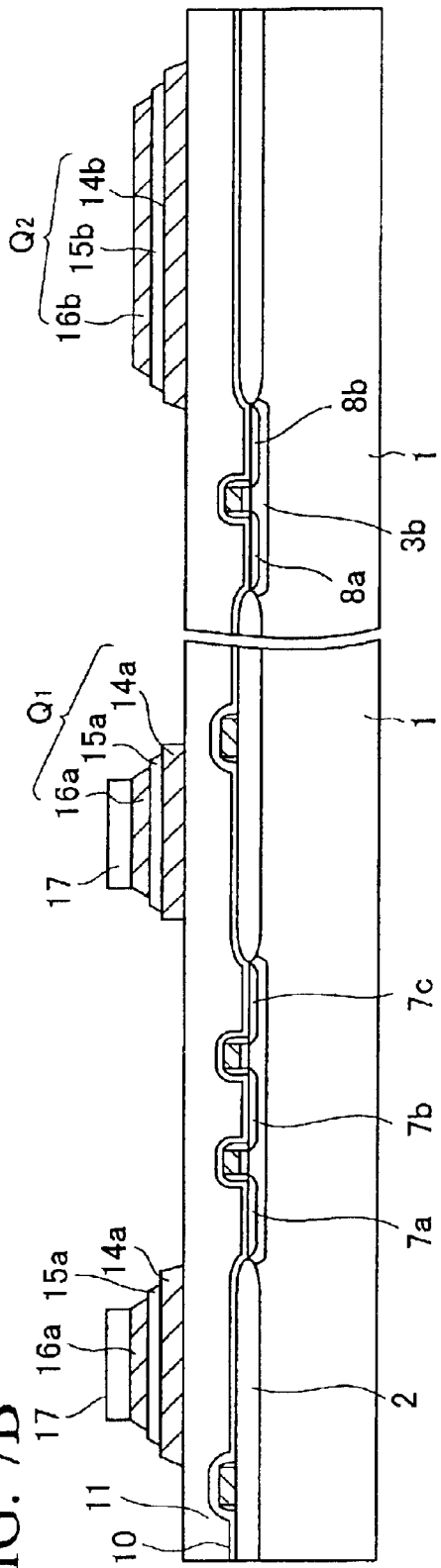
FIG. 7A
FIG. 7B

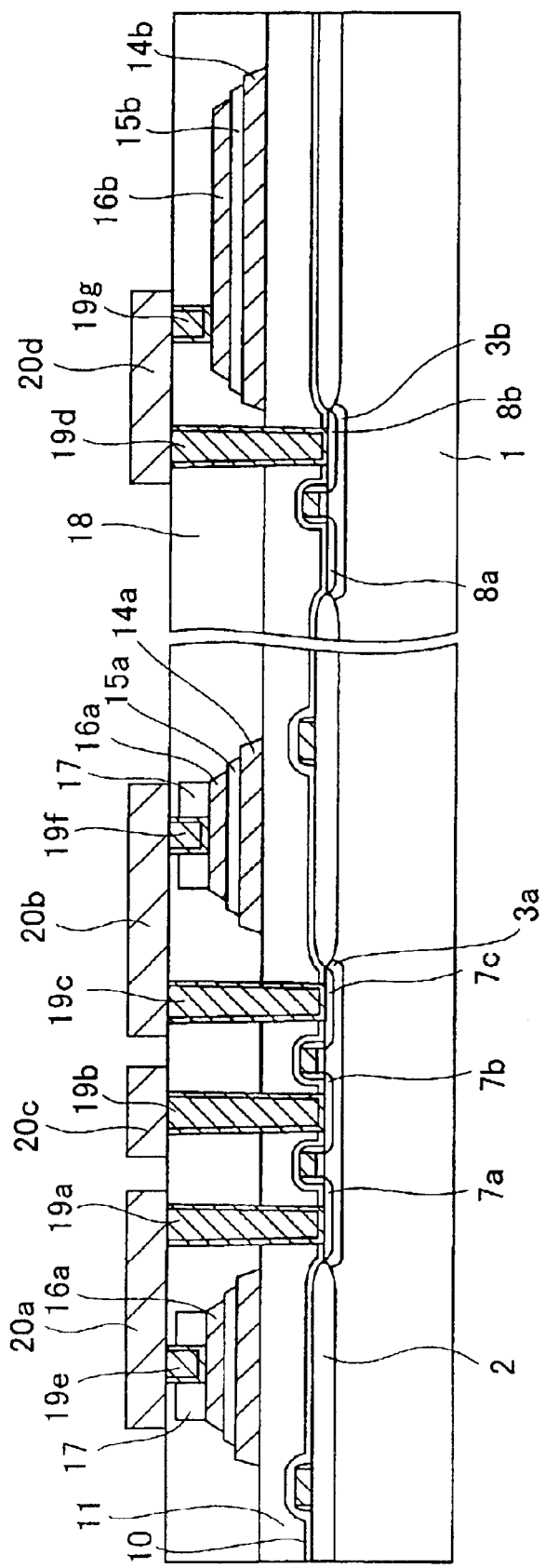

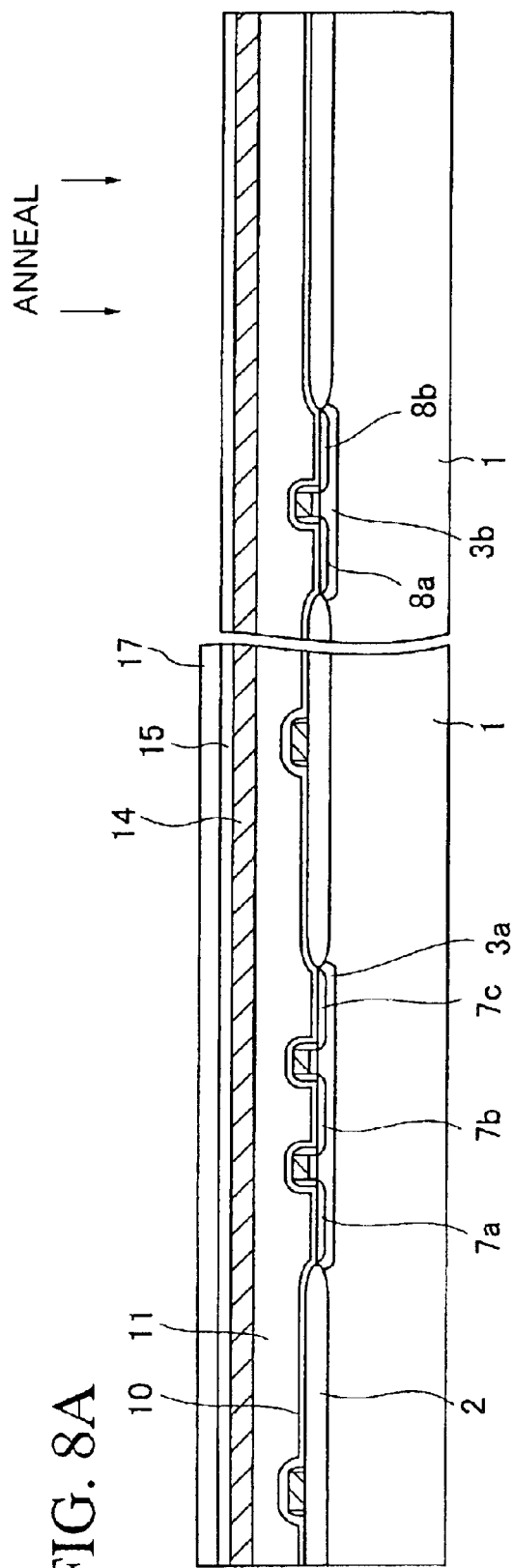
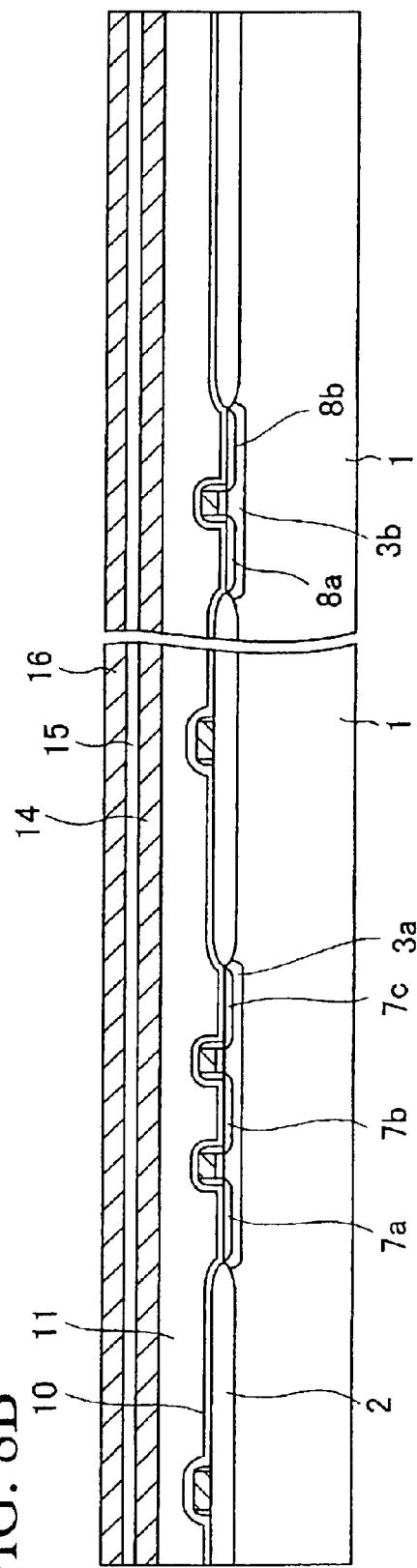
FIG. 8A
FIG. 8B

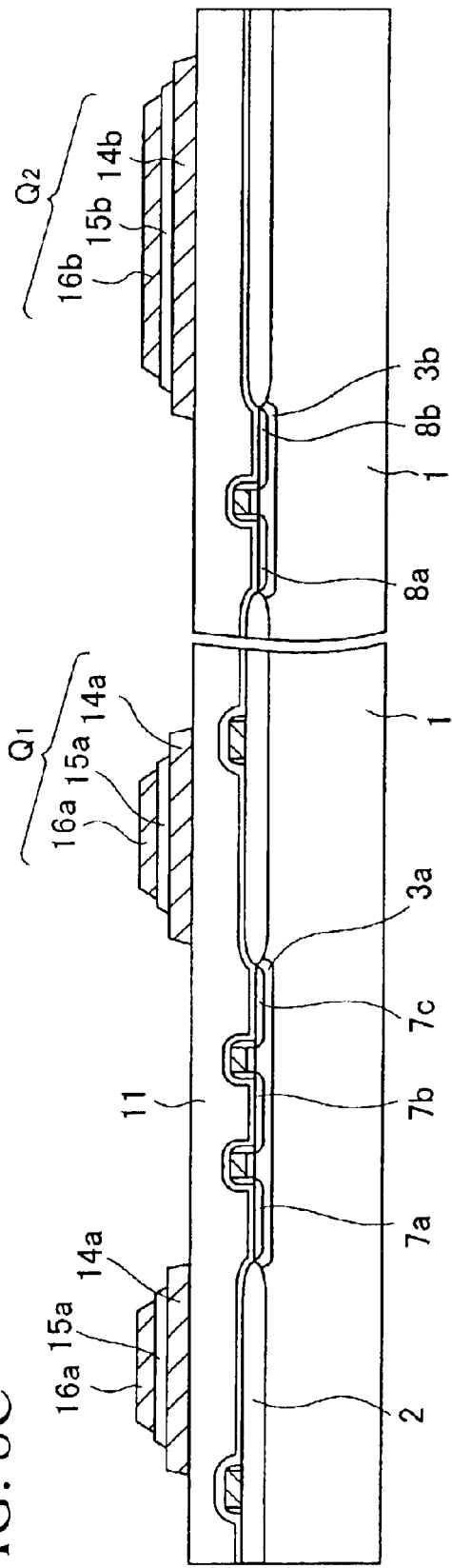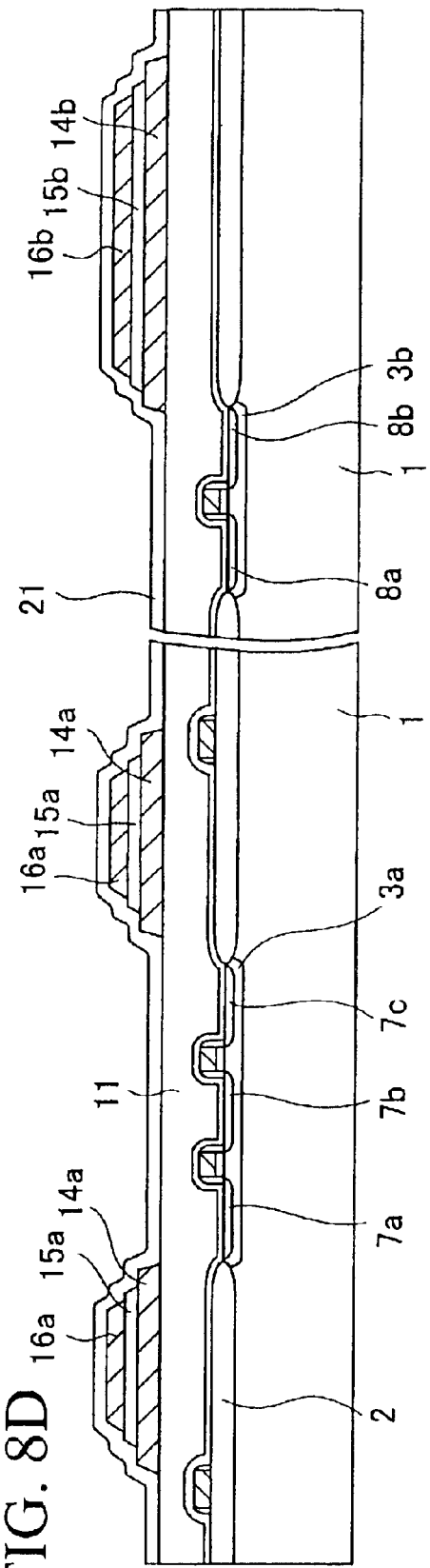

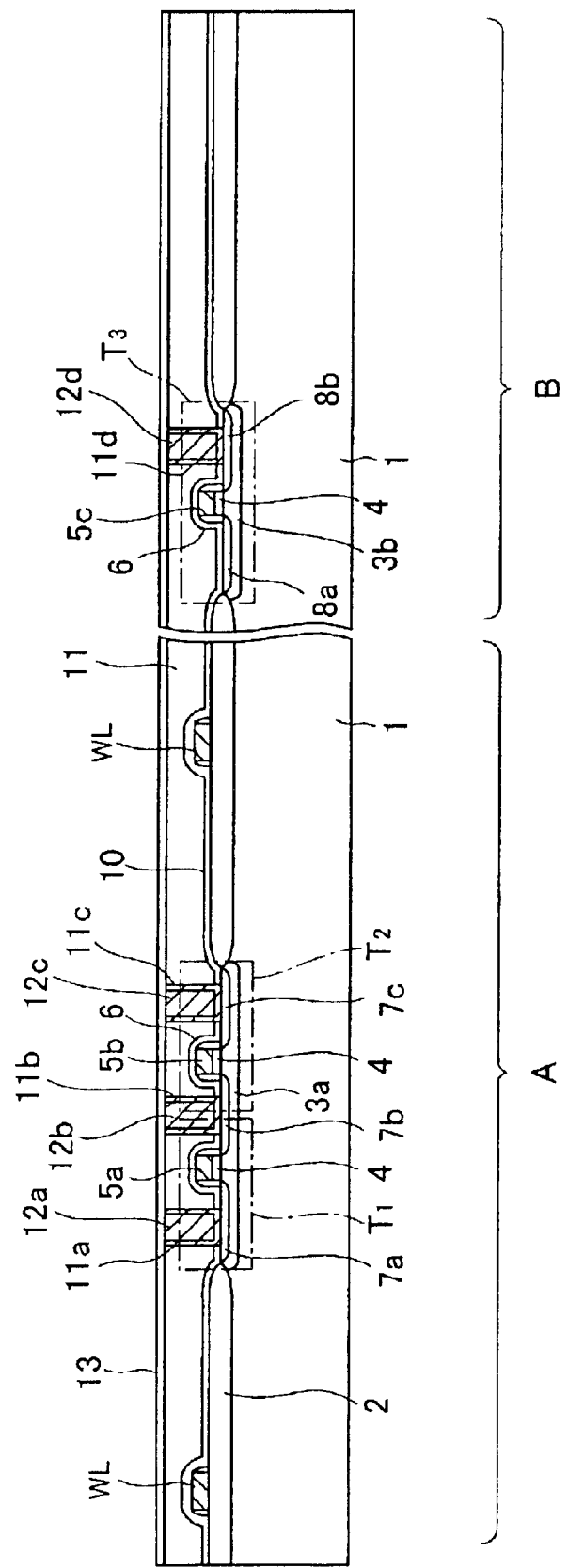

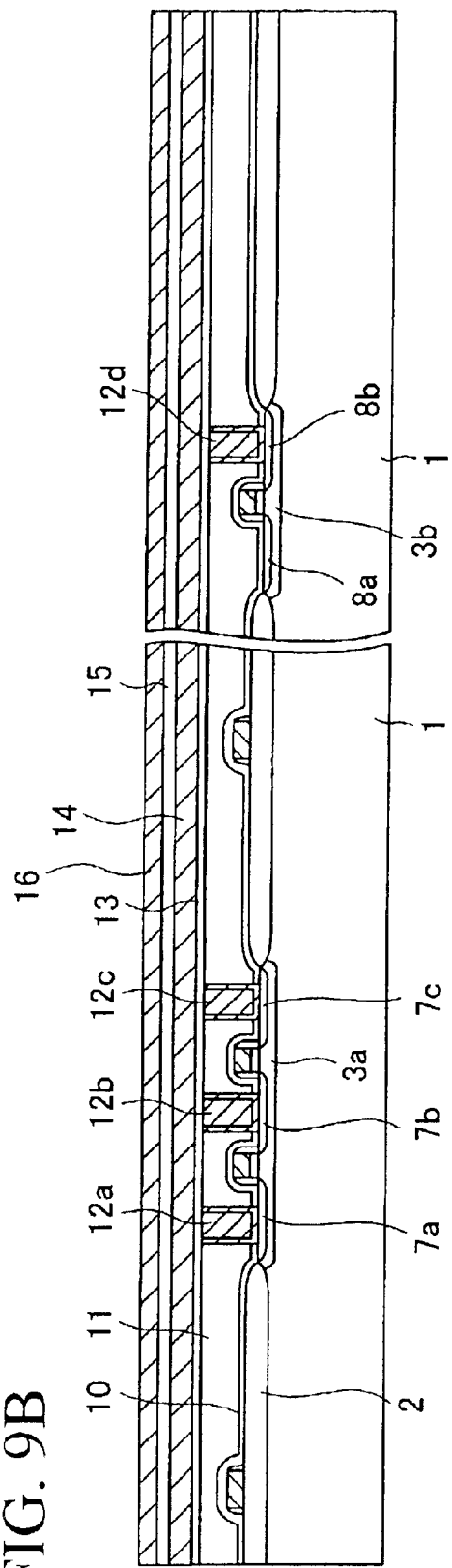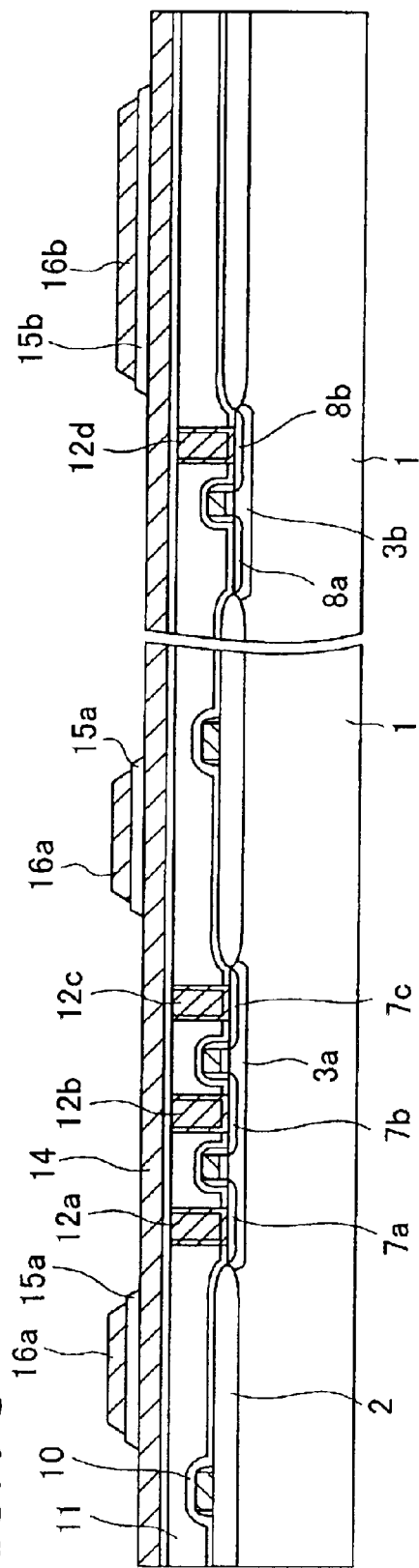

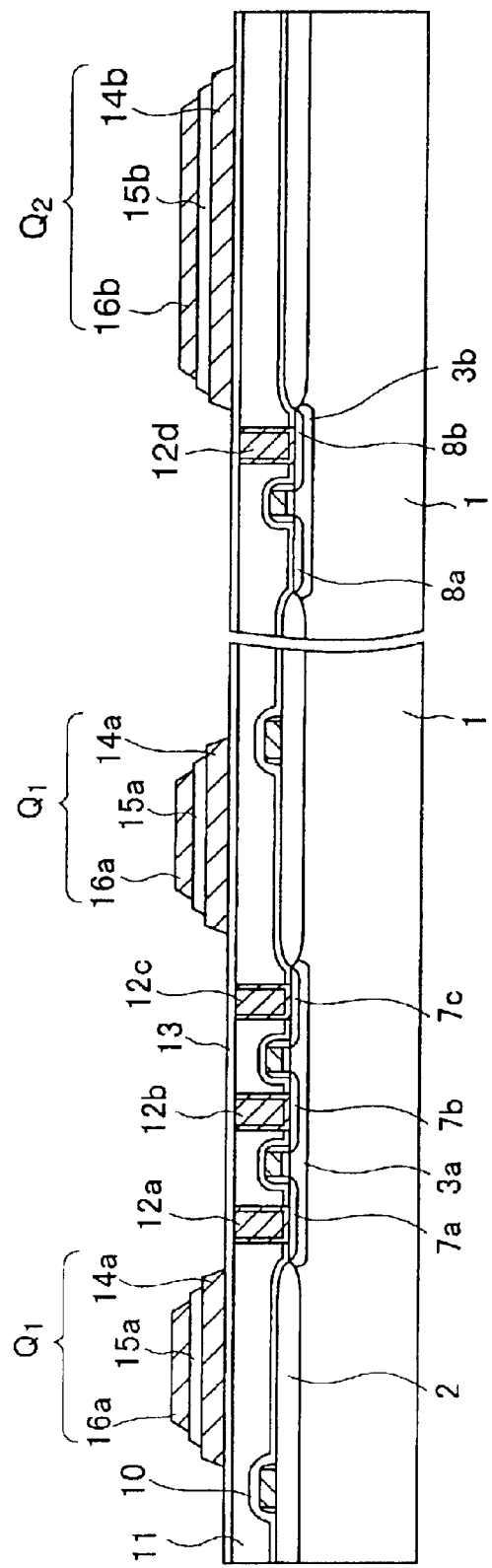
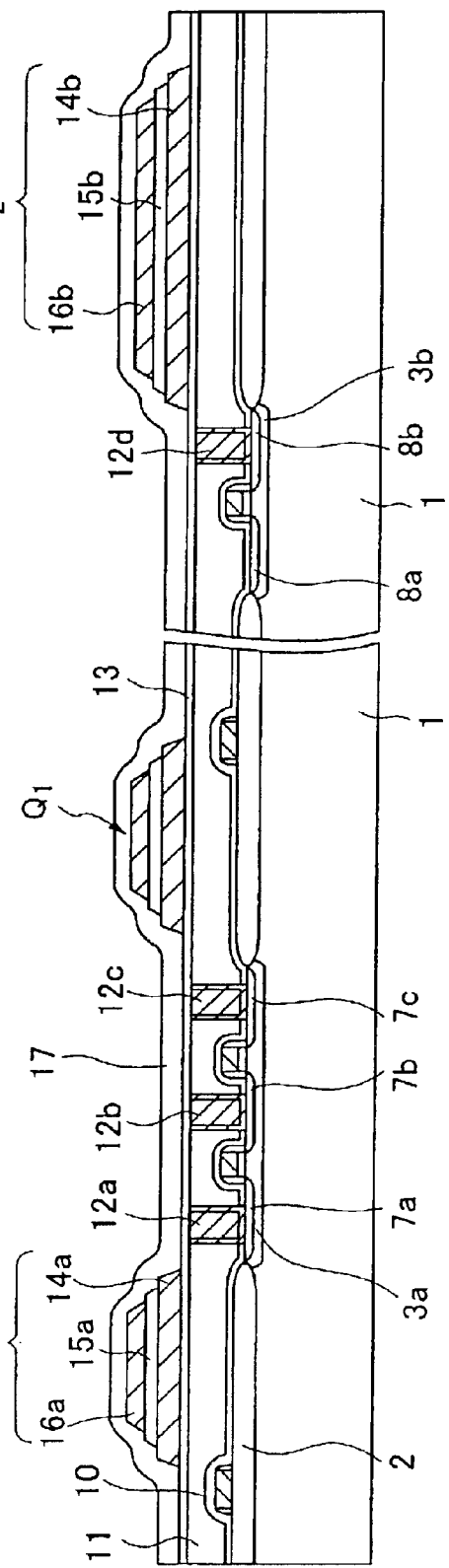

SEMICONDUCTOR DEVICE AND METHOD OF MANUFACTURING THE SAME

CROSS-REFERENCE TO RELATED APPLICATIONS

This application is based upon and claims priority of Japanese Patent Application No.2002-077714, filed in Mar. 20, 2002, the contents being incorporated herein by reference.

BACKGROUND OF THE INVENTION

1. Field of the Invention

The present invention relates to a semiconductor device and a method of manufacturing the same and, more particularly, a semiconductor device having a capacitor and a method of manufacturing the same.

2. Description of the Prior Art

In recent years, as one of the semiconductor memories in which the information can be held after the power supply is shut off and into/from which the information can be written/read with saving the electric power, the FeRAM (Ferroelectric Random Access Memory) is watched with interest.

The FeRAM has the structure that can store the information by utilizing the hysteresis characteristic of the ferroelectric substance. As the ferroelectric material, lead zirconate titanate (PZT), etc. are employed.

In the FeRAM, the first capacitors formed in the memory cell region A and the second capacitor formed in the peripheral circuit region to increase or decrease the power supply voltage are present.

The first capacitors have the function of storing the information based on the polarization inversion (hysteresis) as the feature of the ferroelectric material. The ferroelectric material that is excellent in the ferroelectric characteristics such as the saturation characteristic, the fatigue characteristic, etc. is required.

The fatigue characteristic indicates the feature of deterioration of the memory when the number of writing operations is increased. Also, the fatigue characteristic is the index indicating whether or not the memory can exhibit its sufficient capability at the low voltage.

The second capacitor does not particularly need the employment of the ferroelectric material. The material that has the large capacitance and the small leakage must be selected, like the capacitor employed in the DRAM, etc.

However, in the FeRAM, the dielectric film in both the first capacitor and the second capacitor is constructed by the ferroelectric material.

The reason why the ferroelectric material is selected as the dielectric film of the second capacitor resides in that the capacitance per unit area can be increased rather than the case where the dielectric film is constructed by the silicon oxide, like the capacitor of the DRAM. The ferroelectric material has the large dielectric constant rather than the silicon oxide. For example, the dielectric constant of the silicon oxide is 3.4 whereas the dielectric constant of the PZT as the ferroelectric material is in excess of 100.

In the FeRAM steps in the prior art, the first capacitor and the second capacitor are formed by the same steps, and the area of the second capacitor is formed larger than that of the first capacitor.

However, it is advantageous from the viewpoints of the magnitude of the capacitance, the magnitude of the dielectric constant, as described above, to construct the dielectric film of the capacitor formed in the peripheral circuit region with the ferroelectric material, but such structure has the drawback that the leakage current characteristic is wrong. In other words, such a disadvantage is caused that, as the characteristics of the first capacitor are improved more highly, the leakage current of the second capacitor is increased much more.

SUMMARY OF THE INVENTION

It is an object of the present invention to provide a semiconductor device capable of giving characteristics, which are fitted for applications, to plural types of capacitors formed on the same substrate respectively, and a method of manufacturing the same.

The above object of the present invention is overcome by providing a semiconductor device which comprises an insulating film formed over a semiconductor substrate; a first capacitor having a first lower electrode, a first ferroelectric film, and a first upper electrode, which are formed sequentially over the insulating film in a first region; and a second capacitor having a second lower electrode, a second ferroelectric film, and a second upper electrode, which are formed sequentially over the insulating film in a second region; wherein the first ferroelectric film is formed of first ferroelectric material that comprises plural of elements containing a first element, the second ferroelectric film is formed of second ferroelectric material that comprises plural of elements containing the first element, and a concentration of the first element in the second ferroelectric film is lower than a concentration of the first element in the first ferroelectric film.

Also, the above object of the present invention is overcome by providing a manufacturing method of a semiconductor device which comprises the steps of forming an insulating film over a semiconductor substrate; forming a first conductive film over a first region and a second region of the insulating film; forming a ferroelectric film, which comprises plural of elements containing a first element, on the first conductive film; forming a second conductive film on the ferroelectric film; patterning the second conductive film to form a first upper electrode constituting first capacitor in the first region and also form a second upper electrode constituting a second capacitor in the second region; patterning the ferroelectric film to form a first dielectric film constituting the first capacitor in the first region and also form a second dielectric film constituting the second capacitor in the second region; patterning the first conductive film to form a first lower electrode constituting the first capacitor in the first region and also form a second lower electrode constituting the second capacitor in the second region; and reducing selectively a concentration of the first element in the ferroelectric film of the second dielectric film lower than a concentration of the first element in the ferroelectric film of the first dielectric film.

According to the present invention, the dielectric films of the first capacitors and the dielectric film of the second capacitor, which have the different applications, are formed of the ferroelectric material that contains plural elements respectively. Then, a concentration of a predetermined element, which serves as a leakage-current increasing factor, for example, in the ferroelectric material is reduced selectively low in the dielectric film of the second capacitor. Adjustment of the concentration of the predetermined element can be executed by the annealing after the ferroelectric film is formed.

Therefore, plural types of capacitors can be formed by forming the ferroelectric film only one time in response to the applications. Thus, steps of forming the semiconductor device are never largely increased in order to form individually the capacitors in response to the applications, and also the increase in cost can be suppressed.

For example, the PZT film is employed as the ferroelectric film, the leakage current of the second capacitor can be reduced by reducing the concentration of the lead as the constitutive element by virtue of the annealing. Also, if the first capacitors are covered with the protection insulating film in order to prevent the elimination of the constitutive element, the deterioration of the saturation characteristic and the fatigue characteristic of the first capacitor by the annealing is avoided.

BRIEF DESCRIPTION OF THE DRAWINGS

FIGS. 1A to 1J are sectional views showing steps of manufacturing a semiconductor device according to a first embodiment of the present invention;

FIGS. 6A to 6E are sectional views showing steps of manufacturing a semiconductor device according to a second embodiment of the present invention;

FIGS. 7A and 7C are sectional views showing steps of manufacturing a semiconductor device according to a third embodiment of the present invention;

FIGS. 8A to 8E are sectional views showing steps of manufacturing a semiconductor device according to a fourth embodiment of the present invention;

FIGS. 9A to 9J are sectional views showing steps of manufacturing a semiconductor device according to a fifth embodiment of the present invention.

DESCRIPTION OF THE PREFERRED EMBODIMENTS

Embodiments of the present invention will be explained with reference to the drawings hereinafter.

(First Embodiment)

FIGS. 1A to 1J are sectional views showing steps of forming a semiconductor memory device according to a first embodiment of the present invention.

Figure 1A:
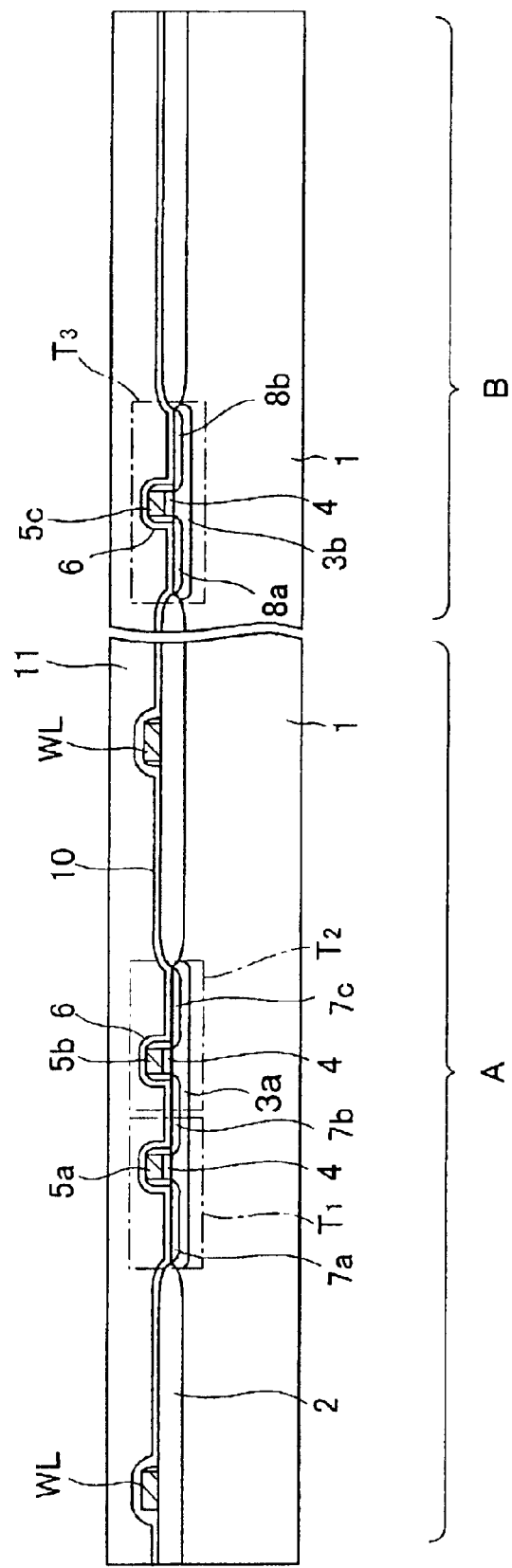

First, steps required until a sectional structure shown in FIG. 1A is formed will be explained hereunder.

In FIG. 1A, an element isolation insulating film 2 is formed on a surface of a p-type silicon (semiconductor) substrate 1 by the LOCOS (Local Oxidation of Silicon) method. In this case, as the element isolation insulating film 2, the STI (Shallow Trench Isolation) structure may be employed in addition to the silicon oxide film formed by the LOCOS method.

After the element isolation insulating film 2 is formed, a p-type impurity and an n-type impurity are selectively introduced into predetermined active regions (transistor forming regions) in a memory cell region A and a peripheral circuit region B of the silicon substrate 1 respectively. Thus, a p-well 3a is formed in an active region in the memory cell region A, and an n-well 3b is formed in an active region in the peripheral circuit region B.

In this case, although not shown in FIG. LA, a p-well (not shown) is also formed in the peripheral circuit region B to form the CMOS.

Then, a silicon oxide film that is used as a gate insulating film 4 on the p-well 3a and the n-well 3b is formed by thermally oxidizing the surface of the silicon substrate 1.

Then, an amorphous silicon film and a tungsten silicide film are formed sequentially on the element isolation insulating film 2 and the gate insulating film 4. Then, the amorphous silicon film and the tungsten silicide film are patterned into predetermined shapes by the photolithography method. Thus, gate electrodes 5a, 5b are formed on the p-well 3a and a gate electrode 5c is formed on the n-well 3b.

In the memory cell region A, two gate electrodes 5a, 5b are formed at an interval in almost parallel on the p-well 3a. These gate electrodes 5a, 5b are extended onto the element isolation insulating film 2 to act as the word line WL.

In this case, a polysilicon film may be formed in place of the amorphous silicon film constituting the gate electrodes 5a to 5c.

Then, first to third n-type impurity diffusion regions 7a, 7b, 7c serving as the source/drain of the n-channel MOS transistors $T_1$, $T_2$ are formed by ion-implanting the n-type impurity into the p-well 3a in the memory cell region A on both sides of the gate electrodes 5a, 5b. The second n-type impurity diffusion region 7b positioned at the center of the p-well 3a is connected electrically to the bit line, and the first and third n-type impurity diffusion regions 7a, 7c positioned on both sides of the p-well 3a are connected electrically to a capacitor respectively.

Then, first and second p-type impurity diffusion regions 8a, 8b serving as the source/drain of the p-channel MOS transistor $T_3$ are formed by ion-implanting the p-type impurity into the n-well 3b in the peripheral circuit region B on both sides of the gate electrode 5c.

Then, an insulating film is formed on the silicon substrate 1, the element isolation insulating film 2, and the gate electrodes 5a, 5b, 5c. Then, a sidewall insulating film 6 is left on both side portions of the gate electrodes 5a to 5c respectively by etching back the insulating film. As the insulating film, a silicon oxide ($SiO_2$) formed by the CVD method, for example, is used.

Then, the n-type impurity diffusion regions 7a to 7c are formed into the LDD structure by ion-implanting the n-type impurity into the n-type impurity diffusion regions 7a to 7c while using the gate electrodes 5a, 5b and the sidewall insulating films 6 on the p-well 3a as a mask. Also, the p-type impurity diffusion regions 8a, 8b are formed into the LDD structure by ion-implanting the p-type impurity into the p-type impurity diffusion regions 8a, 8b while using the gate electrode 5c and the sidewall insulating films 6 on the n-well 3b as a mask.

In this case, the above individual implantation of the n-type impurity and the p-type impurity is carried out by using the resist patterns (not shown).

Accordingly, the formation of the first nMOS transistor $T_1$ having the first and second n-type impurity diffusion regions 7a, 7b and the gate electrode 5a, the formation of the second nMOS transistor $T_2$ having the second and third n-type impurity diffusion regions 7b, 7c and the gate electrode 5b, and the formation of the pMOS transistor $T_3$ having the first and second p-type impurity diffusion regions 8a, 8b and the gate electrode 5c are completed.

Then, a cover film 10 for covering the nMOS transistors $T_1$, $T_2$ and the pMOS transistor $T_3$ is formed on the silicon substrate 1 by the plasma CVD method. As the cover film 10, a silicon oxide nitride (SiON) film, for example, is formed.

Then, a silicon oxide ($SiO_2$) film of about 1.0 $\mu$m thickness is grown by the plasma CVD method using the TEOS gas. This silicon oxide film is used as a first interlayer insulating film 11.

Then, as the densifying process of the first interlayer insulating film 11, this first interlayer insulating film 11 is annealed in the normal-pressure nitrogen atmosphere at the temperature of 700° C. for 30 minute. Then, an upper surface of the first interlayer insulating film 11 is polished by the CMP (Chemical Mechanical Polishing) method to planarize.

Next, steps required until a structure shown in FIG. 1B is formed will be explained hereunder.

First, a titanium (Ti) film and a platinum (Pt) film are formed sequentially as a first conductive film 14 on the first interlayer insulating film 11. The Ti film and the Pt film are formed by the DC sputter method. In this case, a thickness of the Ti film is set to about 10 to 30 nm and a thickness of the Pt film is set to about 100 to 300 nm. In this case, as the first conductive film 14, any one conductive film of iridium, ruthenium, ruthenium oxide, iridium oxide, strontium ruthenium oxide ($SrRuO_3$), etc. may be formed.

Then, a lead zirconate titanate (PZT; $Pb(Zr_{1-x}Ti_x)O_3$) film of 100 to 300 nm thickness is formed as a ferroelectric film 15 on the first conductive film 14 by the RF sputter method. As the method of forming the ferroelectric film 15, in addition to the above, there are the MOD (Metal Organic Deposition) method, the MOCVD (Metal Organic CVD) method, the sol-gel method, and others. Also, as the material of the ferroelectric film 15, in addition to PZT, other PZT material such as PLCSZT, PLZT, or the like, the Bi layered-structure compound such as $SrBi_2Ta_2O_9$(SBT, Y1), $SrBi_2(Ta,Nb)_2O_9$ (SBTN, YZ), or the like, and other metal oxide ferroelectric substance may be employed.

Then, as the crystallizing process of the PZT film constituting the ferroelectric film 15, RTA (Rapid Thermal Annealing) is carried out in the oxygen atmosphere at the temperature of 650 to 850° C. for 30 to 120 second. For example, the ferroelectric film 15 is annealed at the temperature of 700° C. for 60 second.

Then, an iridium oxide ($IrO_2$) film of 100 to 300 nm thickness is formed as a second conductive film 16 on the ferroelectric film 15 by the sputter method. In this case, as the second conductive film 16, platinum or strontium ruthenium oxide (SRO) may be employed.

Next, steps required until a structure shown in FIG. 1C is formed will be explained hereunder.

First, the second conductive film 16 is patterned. Thus, a plurality of capacitor upper electrodes 16a are formed over the element isolation insulating film 2 in the memory cell region A, and also a capacitor upper electrode 16b is formed over the element isolation insulating film 2 in the peripheral circuit region B.

Then, the ferroelectric film 15 is patterned. Thus, stripe-like capacitor dielectric films 15a that extend in almost parallel with the word line WL are formed under plural upper electrodes 16a in the memory cell region A, and also a capacitor dielectric film 15b is formed under the upper electrode 16b in the peripheral circuit region B.

Then, as shown in FIG. 1D, the first conductive film 14 is patterned. Thus, capacitor lower electrodes 14a that extend like a stripe are formed under the dielectric films 15a in the memory cell region A, and also a capacitor lower electrode 14b is formed under the dielectric film 15b in the peripheral circuit region B.

Accordingly, the first capacitors $Q_1$ each having the lower electrode 14a, the dielectric film 15a, and the upper electrode 16a are formed in the memory cell region A. Also, the second capacitor $Q_2$ having the lower electrode 14b, the dielectric film 15b, and the upper electrode 16b is formed in the peripheral circuit region B.

The first capacitor $Q_1$ has a planar shape of about 2.0 $\mu$m×1.8 $\mu$m in size, for example, and the information is written/read into/from this capacitor based on the hysteresis characteristic of the ferroelectric film. Also, the second capacitor $Q_2$ has a planar shape of about 25 $\mu$m×10 $\mu$m in size, for example, and is used for the boost of the voltage, etc.

Then, as shown in FIG. 1E, a silicon oxide film (TEOS film) of about 200 nm thickness is formed as a protection insulating film 17 on the first and second capacitors $Q_1$, $Q_2$ and the first interlayer insulating film 11 by the CVD method using the mixed gas consisting of TEOS (tetraethoxysilane), helium, and oxygen, for example.

In this case, as the protection insulating film 17, in addition to the TEOS film, a silicon oxide film formed by using silane ($SiH_4$) and oxygen ($O_2$), a silicon nitride film, a silicon nitride oxide film, or the like may be applied.

Then, as shown in FIG. 1F, the protection insulating film 17 is patterned by the photolithography method to remove from at least the upper surface of the second capacitor $Q_2$ in the peripheral circuit region B. The patterning of the protection insulating film 17 is carried out by the down-flow plasma or RIE (Reactive Ion Etching) etching while using the mixed gas consisting of $CF_4$ $C_4F_8$ and $O_2$ as the etching gas and the resist mask (not shown), for example.

Then, the silicon substrate 1 is put into the normal-pressure oxygen ($O_2$) atmosphere. Then, the second capacitor $Q_2$ that is not covered with the protection insulating film 17 is annealed at the temperature of 650° C. for 60 minute, for example.

Accordingly, the elimination of the lead (Pb) from the PZT film, for example, constituting the ferroelectric film of the second capacitor $Q_2$ in the peripheral circuit region B is accelerated. As a result, the leakage current of the second capacitor $Q_2$ is reduced rather than that generated before the annealing. In contrast, since the first capacitors $Q_1$ in the memory cell region A are covered with the protection insulating film 17, the elimination of the constitutive atoms is prevented.

In this case, the annealing of the second capacitor $Q_2$ may be carried out in the reduced-pressure atmosphere to accelerate the elimination of Pb further more. Also, it is preferable that the annealing temperature of the second capacitor $Q_2$ should be set to more than 650° C. In addition, the gas being introduced into the annealing atmosphere is not limited to the oxygen, and any of the mixed gas of the oxygen and the argon, the nitrogen gas, etc. may be employed. Theses conditions are similarly applied in the following embodiments.

Then, as shown in FIG. 1G, a silicon oxide film of about 1 μm is formed as a second interlayer insulating film 18 on the protection insulating film 17, the first interlayer insulating film 11, and the second capacitor $Q_2$. This silicon oxide film is formed by the CVD method using the mixed gas consisting of TEOS, helium, and oxygen.

In this case, the second interlayer insulating film 18 may be formed by using the silane. In such case, the protection insulating film 17 in the memory cell region A prevents the reducing gas from entering into the first capacitors $Q_1$.

Then, an upper surface of the second interlayer insulating film 18 is planarized by the CMP method. In this example, a remaining film thickness of the second interlayer insulating film 18 after the CMP, when measured together with a film thickness of the protection insulating film 17, is set to about 300 nm on the capacitor in the memory cell region A.

Then, as shown in FIG. 1H, first to fourth contact holes 18a to 18d are formed on the first to third n-type impurity diffusion regions 7a to 7c and the second p-type impurity diffusion region 8b respectively by patterning the second interlayer insulating film 18, the protection insulating film 17, the first interlayer insulating film 11, and the cover film 10 by virtue of the photolithography method. At the same time, fifth and sixth contact holes 18e, 18f are formed on the upper electrodes 15a of plural first capacitors $Q_1$ on the p-well 3a respectively by patterning the second interlayer insulating film 18 and the protection insulating film 17. In addition, a seventh contact hole 18g is formed on the upper electrode 15b of the second capacitor $Q_2$ by patterning the second interlayer insulating film 18 in the same patterning step.

Then, a Ti film of 20 nm thickness and a TiN film of 50 nm thickness are formed sequentially on the second interlayer insulating film 18 and in the first to seventh contact holes 18a to 18g by the sputter, and then a W film is formed on the TiN film by the CVD method. The W film is formed to have a thickness that buries completely the inside of the first to seventh contact holes 18a to 18g.

Then, as shown in FIG. 1I, the Ti film, the TiN film, and the W film are polished by the CMP method to remove from the upper surface of the second interlayer insulating film 18. Accordingly, the Ti film, the TiN film, and the W film being left in the first to seventh contact holes 18a to 18g are used as first to seventh conductive plugs 19a to 19g respectively.

Then, a metal film having a quintuple-layered structure, which consists of a TiN film of 150 nm thickness, a Ti film of 5 nm thickness, an Al—Cu film of 500 nm thickness, a TiN film of 50 nm thickness, and a Ti film of 20 nm thickness, is formed as a wiring metal film on the second interlayer insulating film 18 and the first to seventh conductive plugs 19a to 19g. Then, the wiring metal film is patterned by the photolithography method.

Figure 1J:
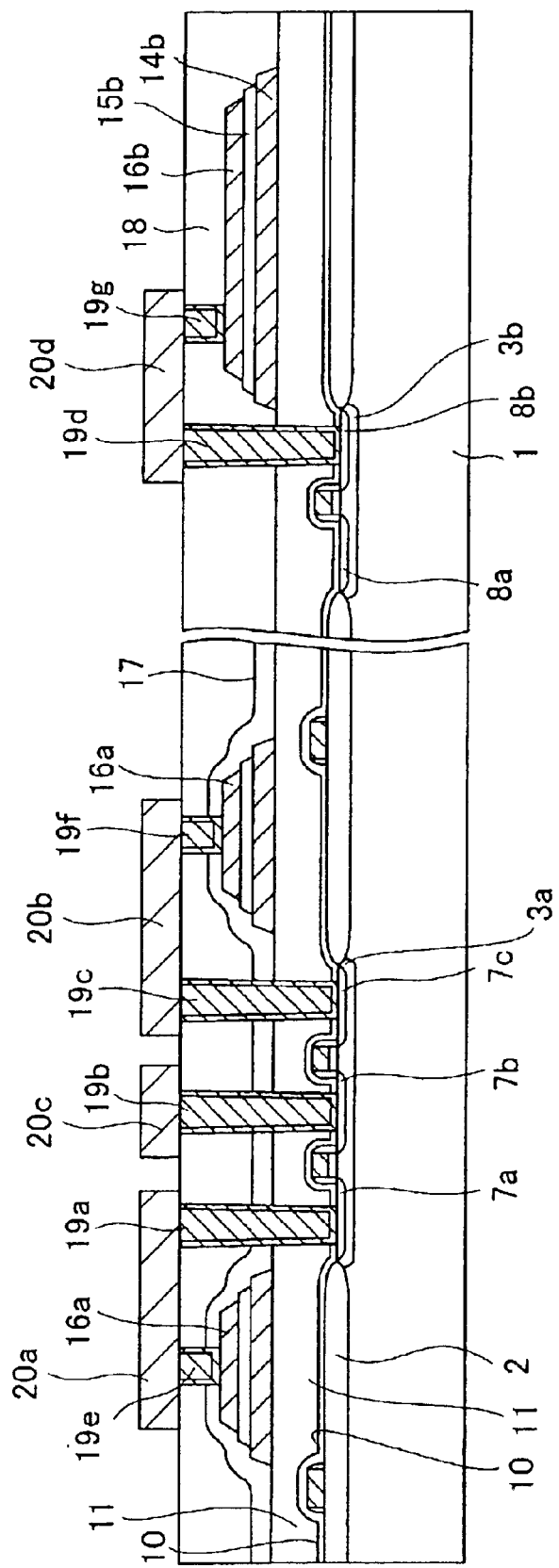

According to the patterning of this wiring metal film, as shown in FIG. 1J, first and second metal wirings 20a, 20b and a conductive pad 20c are formed on the second interlayer insulating film 18 in the memory cell region A, while a third metal wiring 20d is formed on the second interlayer insulating film 18 in the peripheral circuit region B.

Accordingly, over the p-well 3a in the memory cell region A, the upper electrode 16a of one first capacitor $Q_1$ and the first n-type impurity diffusion region 7a are connected electrically to each other via the first metal wiring 20a and the first and fifth conductive plugs 19a, 19e. Also, the upper electrode 16a of the other first capacitor $Q_1$ and the third n-type impurity diffusion region 7c are connected electrically to each other via the second metal wiring 20b and the third and sixth conductive plugs 19c, 19f. In this case, the second n-type impurity diffusion region 7b is connected electrically to the bit line (not shown), which is formed over the second n-type impurity diffusion region 7b, via the conductive pad 20c and the second conductive plug 19b.

Also, in the peripheral circuit region B, the second p-type impurity diffusion region 8b is connected electrically to the upper electrode 16b of the second capacitor $Q_2$ via the third metal wiring 20d and the fourth and seventh conductive plugs 19d, 19g.

After the first to third metal wirings 20a, 20b, 20d are formed, a third interlayer insulating film is formed, then conductive plugs are formed, and then the bit line, etc. are formed on the third interlayer insulating film. But their details will be omitted herein.

According to the above embodiment, in the situation that the first capacitors $Q_1$ formed in the memory cell region A are covered with the protection insulating film 17, the second capacitor $Q_2$ used to step up the voltage, or the like in the peripheral circuit region B is exposed and then annealed selectively. Therefore, in the second capacitor $Q_2$, the atoms acting as the leakage current increasing factor are discharged from the ferroelectric film 15b to reduce the leakage current.

Meanwhile, it was examined how the fatigue characteristic, the saturation characteristic, and the leakage current of the capacitor are changed according to concentrations (composition ratios) of lead (Pb), zirconium (Zr), and titanium (Ti) contained in the PZT film constituting the capacitor dielectric film, i.e., concentrations of the constitutive elements. Then, results described in the following were obtained.

First, with regard to the fatigue characteristic, a relationship between a Pb concentration in the PZT film and a reducing rate of an amount of polarization charge $Q_{SW}$ of the PZT film was examined. Then, the results shown in FIG. 2 were obtained, and it was understood that an amount of polarization charge $Q_{SW}$ is also reduced with the reduction in the Pb concentration.

Also, with regard to the saturation characteristic, a relationship between the Pb concentration contained in the PZT film and a saturation voltage of the polarization charge of the capacitor was examined. Then, the results shown in FIG. 3 were obtained, and it was understood that the saturation voltage is increased with the reduction in the Pb concentration. In this case, an ordinate of FIG. 3 denotes a voltage (V90) that is 90% of the saturation voltage value.

Figure 2:
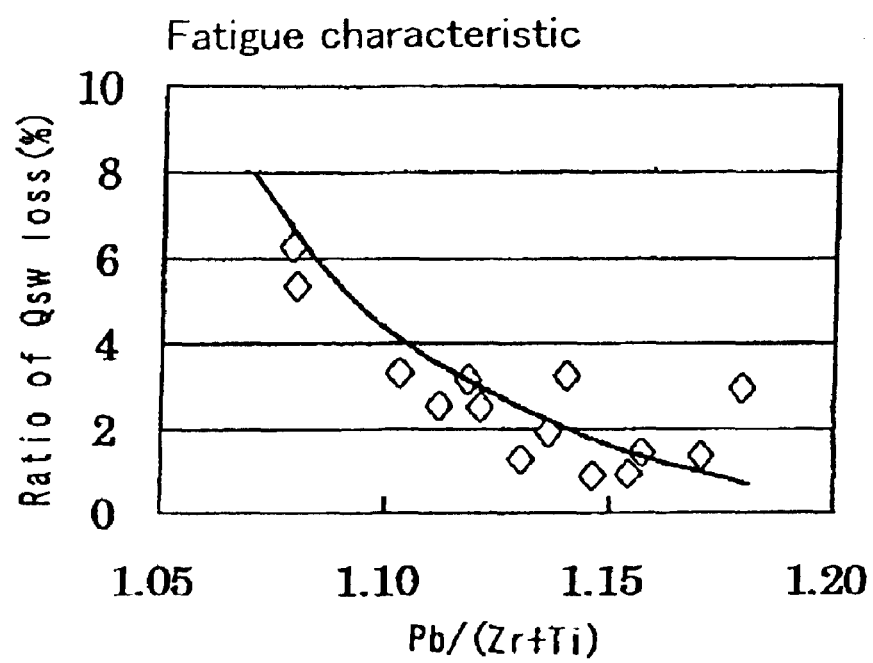
FIG. 2 is a graph showing a relationship between a lead concentration in a PZT film used in a capacitor of the semiconductor device according to the first embodiment of the present invention and a polarization charge loss factor due to the fatigue.
Figure 3:
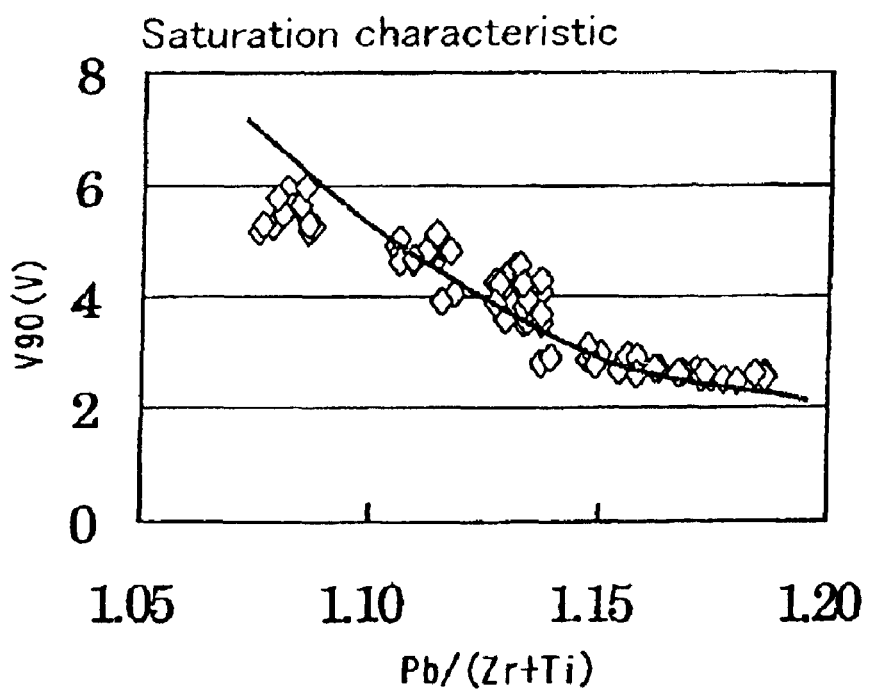
FIG. 3 is a graph showing a relationship between the lead concentration in the PZT film used in the capacitor of the semiconductor device according to the first embodiment of the present invention and a saturation voltage.

According to FIG. 2 and FIG. 3, the reduction of Pb in the PZT film causes the deterioration of the ferroelectric characteristic. Therefore, after the PZT film of the first capacitors $Q_1$ in the memory cell region A is formed to have the optimum composition value, the elimination of Pb from the PZT film must be prevented.

Figure 4:
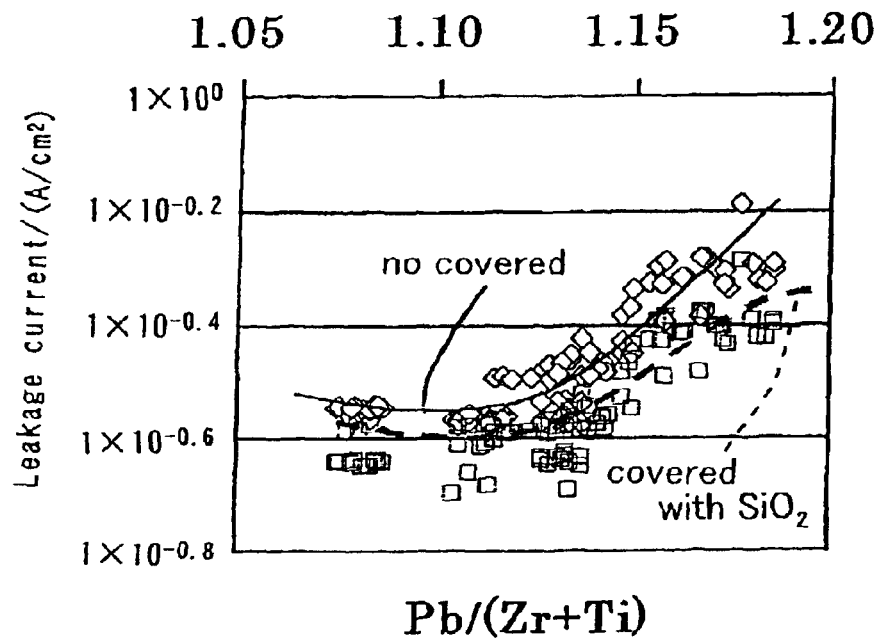
FIG. 4 is a graph showing a relationship between the lead concentration in the PZT film used in the capacitor of the semiconductor device according to the first embodiment of the present invention and a leakage current.

By the way, when the ferroelectric capacitor is annealed in the oxygen atmosphere at 650° C. for 60 minute, a relationship between a leakage current and the Pb concentration of the ferroelectric capacitor, which is not covered with the protection insulating film 17, is given by a solid line in FIG. 4. In contrast, when the ferroelectric capacitor is annealed in the oxygen atmosphere at 650° C. for 60 minute, a relationship between the leakage current and the Pb concentration of the ferroelectric capacitor, which is covered with the protection insulating film 17, is given by a broken line in FIG. 4.

According to FIG. 4, it is appreciated that the leakage current per a unit area is reduced as the Pb concentration is reduced. Also, it is understood from FIG. 4 that, even if the Pb concentration is equal, the leakage current per the unit area becomes small when the ferroelectric capacitor is not covered with the protection insulating film 17.

Accordingly, if the same voltage is applied to the first capacitors $Q_1$ and the second capacitor $Q_2$, the leakage current per the unit area of the second capacitor $Q_2$ becomes smaller than the leakage current per the unit area of the first capacitors $Q_1$.

In this case, the adjustment of the Pb concentration shown in FIG. 2, FIG. 3, and FIG. 4 was carried out while changing the PZT film forming conditions.

Figure 5:
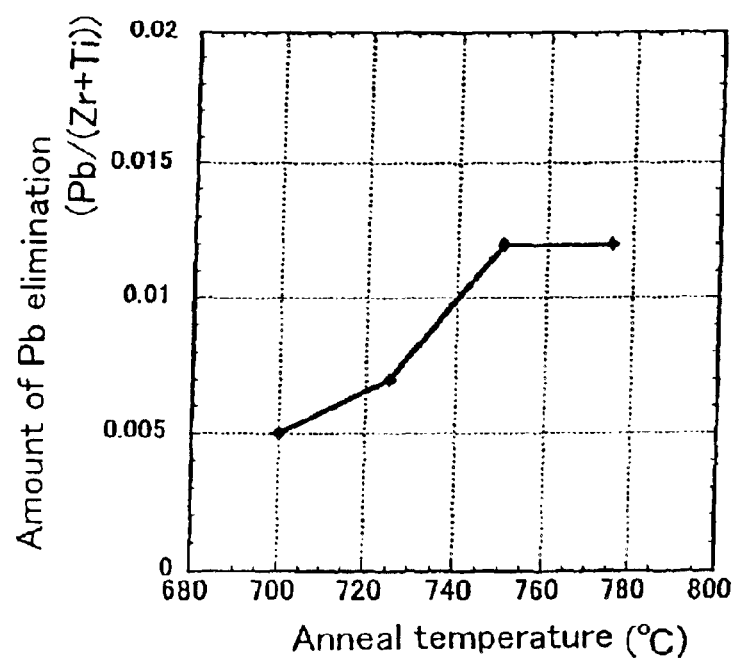
FIG. 5 is a graph showing a relationship between an annealing temperature of the PZT film used in the capacitor of the semiconductor device according to the first embodiment of the present invention and an amount of elimination of lead.

Then, a relationship between the annealing temperature of the ferroelectric capacitor, which is not covered with the protection insulating film 17, and an amount of Pb escape from the PZT film was examined. Then, the results shown in FIG. 5 were obtained. In other words, it was understood that an amount of Pb escape from the PZT film is increased as the anneal temperature is risen. Also, in the state that the anneal temperature is in excess of 750° C., an amount of elimination of Pb is not abruptly increased if the temperature is increased. Therefore, it is preferable that the anneal temperature should be set to 650° C. to 750° C.

With the above, with regard to the ferroelectric film 15 constituting the second capacitor $Q_2$, it is possible to say that it does not cause the problem to reduce Pb by the annealing in the oxygen atmosphere since the saturation characteristic and the fatigue characteristic are not regarded as important, whereas it is important to reduce the leakage current in stepping up the voltage and consequently it is desired to reduce Pb.

In contrast, the first capacitors $Q_1$ are covered selectively with the protection insulating film 17 during the annealing applied to reduce the elements serving as the leakage current increasing factor from the ferroelectric film 15 constituting the second capacitor $Q_2$. Therefore, the reduction of Pb from the first capacitors $Q_1$ is prevented, and also the deterioration of the saturation characteristic and the fatigue characteristic of the ferroelectric film of the first capacitors $Q_1$ is avoided.

By the way, it may be considered that, in order to differentiate the Pb concentration in the ferroelectric film used in the first capacitors $Q_1$ from the Pb concentration in the ferroelectric film used in the second capacitor $Q_2$, these ferroelectric films are formed separately by two steps. More particularly, two film forming steps can be employed such that the ferroelectric film used in the first capacitors $Q_1$ is formed of the material that is excellent in the fatigue characteristic, the saturation characteristic, etc. while the ferroelectric film used in the second capacitor $Q_2$ is formed of the material that has the small leakage current.

However, it is difficult to grow two types of ferroelectric films separately on one semiconductor substrate, and it causes the high cost to form the ferroelectric film two times.

Accordingly, as described above, it is important in step that the second capacitor $Q_2$ in the peripheral circuit region B should be exposing and annealed, while covering the first capacitors $Q_1$ in the memory cell region A with the protection insulating film, to reduce the leakage current.

As described above, if the PZT ferroelectric film is used as the ferroelectric film 15 of the second capacitor $Q_2$, the leakage current of the second capacitor $Q_2$ can be reduced by extracting a part of Pb in the PZT ferroelectric film by virtue of the annealing. On the contrary, if the Bi layered-structure compound is used as the ferroelectric film 15 of the second capacitor $Q_2$, the leakage current of the second capacitor $Q_2$ can be reduced by extracting a part of Bi, Ta in the Bi layered-structure compound by virtue of the annealing. The process of reducing the leakage current by extracting a part of Bi, Ta in the Bi layered-structure compound by virtue of the annealing if the Bi layered-structure compound is used as the ferroelectric film 15 may be employed similarly in following embodiments.

(Second Embodiment)

The annealing timing of the second capacitor $Q_2$ may be selected after the patterning of the ferroelectric film and before the patterning of the first conductive film, as described in the following.

FIGS. 6A to 6E are sectional views showing steps of manufacturing a semiconductor device according to a second embodiment of the present invention.

First, as shown in FIG. 1A, the NMOS transistors $T_1$, $T_2$, etc. are formed in the memory cell region A of the silicon substrate 1 and also the pMOS transistor $T_3$, etc. are formed in the peripheral circuit region B of the silicon substrate 1, and then the cover film 10 and the first interlayer insulating film 11 are formed. Then, as shown in FIG. 1B, the first conductive film 14, the ferroelectric film 15, and the second conductive film 16 are formed sequentially on the first interlayer insulating film 11. Then, as shown in FIG. 1C, the upper electrodes 16a, 16b of the capacitors $Q_1$, $Q_2$ are formed by patterning the second conductive film 16, and then the dielectric films 15a, 15b of the capacitors $Q_1$, $Q_2$ are formed by patterning the ferroelectric film 15.

The above structure is formed in compliance with the steps shown in the first embodiment.

Then, as shown in FIG. 6A, the protection insulating film 17 is formed on the upper electrodes 16a, 16b, the dielectric films 15a, 15b, and the first conductive film 14. As the protection insulating film 17, a silicon oxide film (TEOS film) of about 200 nm thickness is formed by the CVD method using the mixed gas consisting of TEOS, helium, and oxygen, for example.

In this case, as the protection insulating film 17, in addition to the TEOS film, the silicon oxide film formed by using $SiH_4$ and $O_2$, the silicon nitride film, the silicon nitride oxide film, or the like may be applied.

Then, as shown in FIG. 6B, the second capacitor $Q_2$ in the peripheral circuit region B is exposed by patterning the protection insulating film 17 by means of the photolithography method.

Then, the silicon substrate 1 is put into the normal-pressure $O_2$ atmosphere and then annealed at the temperature of 650° C. for 60 minute, for example.

Accordingly, the elimination of Pb from the PZT film, for example, constituting the dielectric film 15b of the second capacitor $Q_2$ in the peripheral circuit region B is accelerated. As a result, the leakage current of the second capacitor $Q_2$ is reduced rather than that generated before the annealing. In contrast, since the first capacitors $Q_1$ in the memory cell region A are covered with the protection insulating film 17, the elimination of Pb from the PZT is prevented. In this case, the annealing of the second capacitor $Q_2$ may be carried out in the reduced-pressure atmosphere so as to promote the Pb escape much more. Also, it is preferable that the anneal temperature of the second capacitor $Q_2$ should be set to more than 650° C.

Figure 6C:
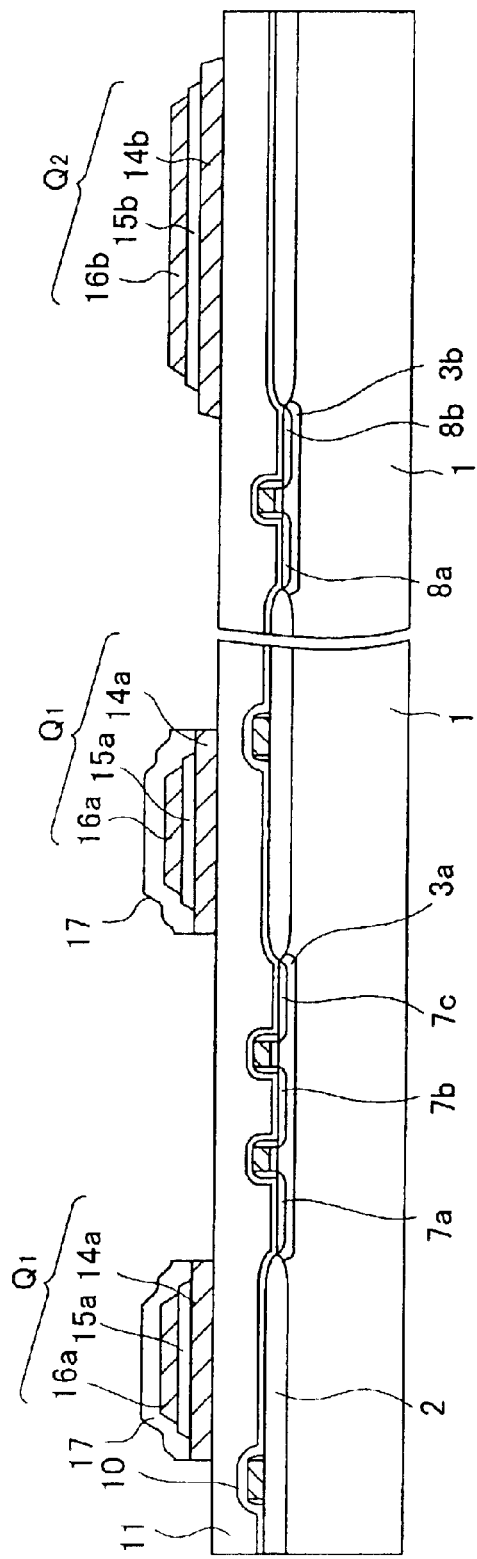

Then, as shown in FIG. 6C, the lower electrodes 14a, 14b are formed under the dielectric films 15a, 15b by patterning the protection insulating film 17 and the first conductive film 14 in the memory cell region A and the first conductive film 14 in the peripheral circuit region B by virtue of the photolithography method respectively.

Accordingly, in the memory cell region A, the first capacitors $Q_1$ each having the lower electrode 14a, the dielectric film 15a, and the upper electrode 16a are formed. Also, in the peripheral circuit region B, the second capacitor $Q_2$ having the lower electrode 14b, the dielectric film 15b, and the upper electrode 16b is formed.

Figure 6D:
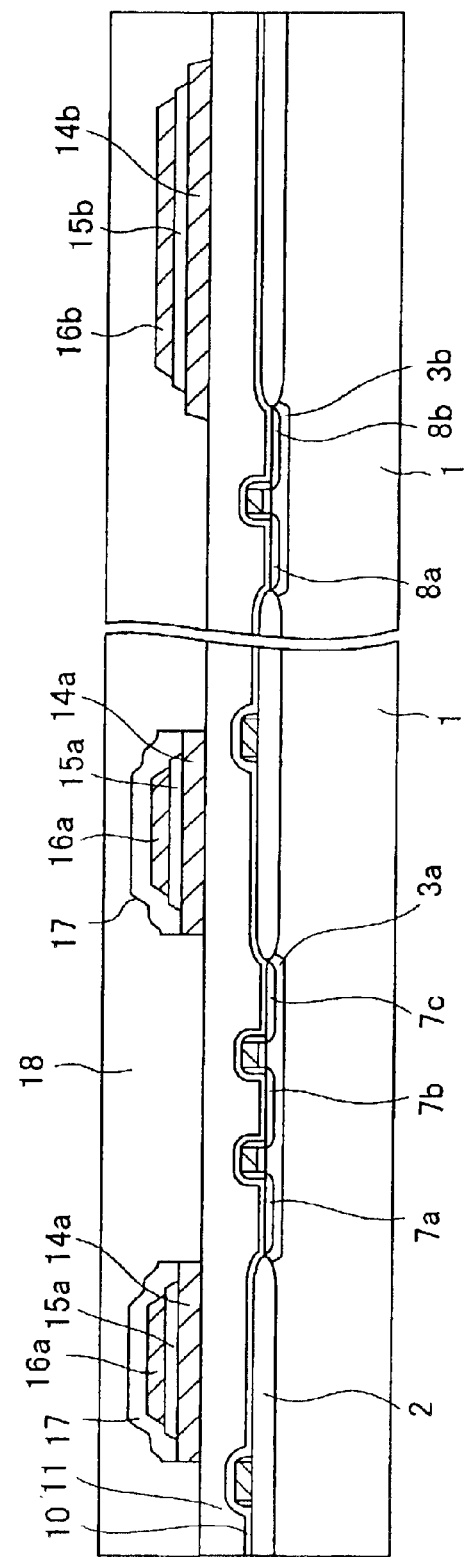

Then, as shown in FIG. 6D, the second interlayer insulating film 18 is formed on the protection insulating film 17, the first interlayer insulating film 11, and the second capacitor $Q_2$.

Then, as shown in FIG. 6E, the first to third conductive plugs 19a to 19c are formed in the second interlayer insulating film 18, the first interlayer insulating film 11, and the cover film 10 on the first to third n-type impurity diffusion regions 7a to 7c respectively, and the fourth conductive plug 19d is formed in these films on the second p-type impurity diffusion region 8b. Also, in the memory cell region A, the fifth and sixth conductive plugs 19e, 19f are formed in the second interlayer insulating film 18 and the protection insulating film 17 on two first capacitors $Q_1$ near the p-well 3a respectively. In addition, in the peripheral circuit region B, the seventh conductive plug 19g is formed in the second interlayer insulating film 18 on the second capacitor $Q_2$. Then, the first to third metal wirings 20a, 20b, 20d and the conductive pad 20b are formed on the second interlayer insulating film.

The conductive plugs 19a to 19g, the first to third metal wirings 20a, 20b, 20d, and the conductive pad 20b are formed in compliance with the steps shown in the first embodiment respectively.

As described above, in the present embodiment, prior to the patterning of the first conductive film 14, the dielectric films 15a and the upper electrodes 16a in the memory cell region A are covered with the protection insulating film 17, while the dielectric film 15b and the upper electrode 16b in the peripheral circuit region B are exposed from the protection insulating film 17. Then, in such state, the dielectric film 15b and the upper electrode 16b in the peripheral circuit region B are annealed in the oxygen atmosphere.

Accordingly, the elimination of Pb from the PZT film constituting the dielectric films 15a of the first capacitor $Q_1$ is prevented, but the elimination of Pb from the PZT film constituting the dielectric films 15b of the second capacitor $Q_2$ is accelerated.

As a result, as explained in the first embodiment, in the memory cell region A, the elimination of Pb from the first capacitor $Q_1$ is prevented and thus the deterioration of the fatigue characteristic and the saturation characteristic is prevented. Also, in the peripheral circuit region B, the elimination of Pb from the second capacitor $Q_2$ is accelerated and thus the fatigue characteristic and the saturation characteristic of the second capacitor $Q_2$ are deteriorated, but the leakage current of the second capacitor $Q_2$ is reduced small rather than the leakage current of the first capacitor $Q_1$.

Accordingly, a plurality of capacitors having different characteristics that are fitted to the applications can be formed by forming the ferroelectric film only once.

By the way, in FIG. 6A, the protection insulating film 17 is formed after the ferroelectric film 15 is formed. However, the protection insulating film 17 may be formed on the upper electrodes 16a, 16b and the ferroelectric film 15 after the upper electrodes 16a, 16b are formed but before the ferroelectric film 15 is patterned. In this case, after the protection insulating film 17 is removed from the upper electrode 16b and its periphery in the peripheral circuit region B by the patterning, a part of the predetermined element, i.e., Pb is extracted from the ferroelectric film 15 in the peripheral circuit region B by executing the annealing in the oxygen atmosphere. Then, the first and second capacitors $Q_1$, $Q_2$ are formed by patterning the ferroelectric film 15 and the first conductive film 14.

In this case, if the second interlayer insulating film 18 is formed by using the silane, the protection insulating film 17 in the memory cell region A prevents the entering of the reducing gas into the first capacitors $Q_1$.

(Third Embodiment)

The annealing timing of the ferroelectric film 15 constituting the second capacitor $Q_2$ may be selected before the patterning of the first conductive film 14, as described in the following.

FIGS. 7A to 7C are sectional views showing steps of manufacturing a semiconductor device according to a third embodiment of the present invention.

First, as shown in FIG. 1A, the nMOS transistors $T_1$, $T_2$, etc. are formed in the memory cell region A of the silicon substrate 1 and also the pMOS transistor $T_3$, etc. are formed in the peripheral circuit region B of the silicon substrate 1, and then the cover film 10 and the first interlayer insulating film 11 are formed. Then, as shown in FIG. 1B, the first conductive film 14, the ferroelectric film 15, and the second conductive film 16 are formed sequentially on the first interlayer insulating film 11. The above structure is formed in compliance with the steps shown in the first embodiment.

Then, as shown in FIG. 7A, the protection insulating film 17 is formed on the second conductive film 16. As the protection insulating film 17, the silicon oxide film (TEOS film) of about 200 nm thickness is formed by the CVD method using the mixed gas consisting of TEOS, helium, and oxygen, for example. In this case, as the protection insulating film 17, in addition to the TEOS film, the silicon oxide film formed by using $SiH_4$ and $O_2$, the silicon nitride film, the silicon nitride oxide film, or the like may be applied.

Then, the protection insulating film 17 in the peripheral circuit region B is removed by the etching, and thus the second conductive film 16 is exposed.

Then, the silicon substrate 1 is put into the normal-pressure $O_2$ atmosphere and then annealed at the temperature of 650° C. for 60 minute, for example. In this case, the annealing may be carried out in the reduced-pressure atmosphere so as to accelerate elimination of Pb much more. Also, it is preferable that the anneal temperature should be set to more than 650° C.

Accordingly, the elimination of Pb from the PZT film constituting the ferroelectric film 15 in the peripheral circuit region B is accelerated, whereas the elimination of Pb from the PZT film constituting the ferroelectric film 15 in the memory cell region A is prevented by the protection insulating film 17.

Then, as shown in FIG. 7B, the protection insulating film 17, the second conductive film 16, the ferroelectric film 15, and the first conductive film 14 are patterned, like the first embodiment. Thus, the first capacitors $Q_1$ are formed in the memory cell region A, and also the second capacitor $Q_2$ is formed in the peripheral circuit region B.

In this case, the protection insulating film 17 may be patterned together with the second conductive film 16, otherwise the protection insulating film 17 may be removed before the patterning of the second conductive film 16. If the protection insulating film 17 is removed, it is preferable that the capacitors $Q_1$, $Q_2$ should be covered with another protection insulating film made of alumina, or the like.

The first capacitors $Q_1$ is constructed by the lower electrode 14a made of the first conductive film 14, the dielectric film 15a made of the ferroelectric film 15, and the upper electrode 16a made of the second conductive film 16. Also, the second capacitors $Q_2$ is constructed by the lower electrode 14b made of the first conductive film 14, the dielectric film 15b made of the ferroelectric film 15, and the upper electrode 16b made of the second conductive film 16.

Meanwhile, since the PZT film constituting the second capacitor $Q_2$ in the peripheral circuit region B is annealed in the state that the PZT film is not covered with the protection insulating film 17, the leakage current is reduced according to the reduction in Pb rather than that generated before the annealing. In contrast, since the first capacitors $Q_1$ in the memory cell region A are covered with the protection insulating film 17 in the annealing, the elimination of Pb is prevented and thus the saturation characteristic and the fatigue characteristic are not deteriorated.

Then, as shown in FIG. 7C, the first to third conductive plugs 19a to 19c are formed in the second interlayer insulating film 18, the first interlayer insulating film 11, and the cover film 10 on the first to third n-type impurity diffusion regions 7a to 7c respectively, and the fourth conductive plug 19d is formed in these films on the second p-type impurity diffusion region 8b. Also, in the memory cell region A, the fifth and sixth conductive plugs 19e, 19f are formed in the second interlayer insulating film 18 and the protection insulating film 17 on two first capacitors $Q_1$ near the p-well 3a respectively. In addition, in the peripheral circuit region B, the seventh conductive plug 19g is formed in the second interlayer insulating film 18 on the second capacitor $Q_2$. Then, the first to third metal wirings 20a, 20b, 20d and the conductive pad 20b are formed on the second interlayer insulating film.

The conductive plugs 19a to 19g, the first to third metal wirings 20a, 20b, 20d, and the conductive pad 20b are formed in compliance with the steps shown in the first embodiment respectively.

As described above, in the present embodiment, prior to the patterning to form the capacitors $Q_1$, $Q_2$, the second conductive film 16 in the memory cell region A is covered with the protection insulating film 17, while the second conductive film 16 in the peripheral circuit region B is exposed. Then, in such state, the ferroelectric film 15 and the second conductive film 16 in the peripheral circuit region B are annealed in the oxygen atmosphere.

Accordingly, the elimination of Pb from the PZT film serving as the dielectric films 15a of the first capacitor $Q_1$, which is formed by patterning the first conductive film 14, the ferroelectric film 15, and the second conductive film 16, is prevented, but the elimination of Pb from the PZT film serving as the dielectric films 15b of the second capacitor $Q_2$ is accelerated.

As a result, as explained in the first embodiment, in the memory cell region A, the elimination of Pb from the first capacitor $Q_1$ is prevented and thus the deterioration of the fatigue characteristic and the saturation characteristic is prevented. Also, in the peripheral circuit region B, the elimination of Pb from the second capacitor $Q_2$ is accelerated and thus the fatigue characteristic and the saturation characteristic of the second capacitor $Q_2$ are deteriorated, but the leakage current of the second capacitor $Q_2$ is reduced small rather than the leakage current of the first capacitor $Q_1$.

Therefore, a plurality of capacitors having different characteristics, each of which is fitted to each application, can be formed by forming the ferroelectric film only once.

(Fourth Embodiment)

The annealing timing of the ferroelectric film 15 constituting the second capacitor $Q_2$ may be selected after the ferroelectric film is formed but before the second conductive film is formed, as described in the following.

FIGS. 8A to 8E are sectional views showing steps of manufacturing a semiconductor device according to a fourth embodiment of the present invention.

First, as shown in FIG. 1A, the nMOS transistors $T_1$, $T_2$, etc. are formed in the memory cell region A of the silicon substrate 1 and also the pMOS transistor $T_3$, etc. are formed in the peripheral circuit region B of the silicon substrate 1, and then the cover film 10 and the first interlayer insulating film 11 are formed. The above structure is formed in compliance with the steps shown in the first embodiment.

Next, steps required until a structure shown in FIG. 8A is formed will be explained hereunder.

First, a titanium (Ti) film and a platinum (Pt) film are formed sequentially as the first conductive film 14 on the first interlayer insulating film 11. The Ti film and the Pt film are formed by the DC sputter method. In this case, a thickness of the Ti film is set to about 10 to 30 nm, and a thickness of the Pt film is set to about 100 to 300 nm. As the first conductive film 14, a film made of iridium, ruthenium, ruthenium oxide, iridium oxide, strontium ruthenium oxide ($SrRuO_3$), or the like may be formed.

Then, the PZT film of 100 to 300 nm thickness is formed as the ferroelectric film 15 on the first conductive film 14 by the RF sputter method. As the method of forming the ferroelectric film 15, there are the MOD method, the MOCVD method, the sol-gel method, etc. Also, as the material of the ferroelectric film 15, other PZT material shown in the first embodiment, the Bi layered-structure compound, and other metal oxide ferroelectric substance may be employed.

Then, the protection insulating film 17 is formed on the ferroelectric film 15. The silicon oxide film (TEOS film) of about 200 nm thickness is formed as the protection insulating film 17 by the CVD method using the mixed gas consisting of TEOS, helium, and oxygen, for example. In this case, as the protection insulating film 17, in addition to the TEOS film, the silicon oxide film formed by using $SiH_4$ and $O_2$, the silicon nitride film, the silicon nitride oxide film, or the like may be applied.

Then, the silicon substrate 1 is put into the normal-pressure $O_2$ atmosphere, and the ferroelectric film 15 is annealed at the temperature of 650° C. for 60 minute, for example. Thus, Pb is discharged from the PZT film constituting the ferroelectric film 15 that is exposed in the peripheral circuit region B.

In this case, the elimination of Pb may be accelerated by the annealing in the reduced-pressure atmosphere. Also, it is preferable that the annealing temperature should be set to more than 650° C.

Accordingly, the elimination of Pb from the PZT film constituting the ferroelectric film 15 is accelerated in the peripheral circuit region B, while the elimination of Pb from the PZT film constituting the ferroelectric film 15 is prevented by the protection insulating film 17 in the memory cell region A. As a result, the Pb composition ratio of the ferroelectric film 15 in the peripheral circuit region B becomes smaller than the Pb composition ratio of the ferroelectric film 15 in the memory cell region A.

Then, the protection insulating film 17 is removed by the dry etching using the plasma of $CF_4$ and $O_2$.

Then, as shown in FIG. 8B, an iridium oxide film of 100 to 300 nm thickness is formed as the second conductive film 16 on the ferroelectric film 15 by the sputter. In this case, a platinum film or a ruthenium oxide film may be employed as the second conductive film 16.

Next, steps required until a structure shown in FIG. 8C is formed will be explained hereunder.

First, the second conductive film 16 is patterned. Thus, a plurality of capacitor upper electrodes 16a are formed in the memory cell region A and simultaneously the capacitors upper electrode 16b is formed in the peripheral circuit region B.

Then, the ferroelectric film 15 is patterned. Thus, the stripe-like capacitor dielectric films 15a that extend in almost parallel with the word like WL are formed under a plurality of upper electrodes 16a in the memory cell region A, and the capacitor dielectric films 15b is formed under the upper electrode 16b in the peripheral circuit region B.

Then, the first conductive film 14 is patterned. Thus, the capacitor lower electrodes 14a that extend like a stripe are formed under the dielectric films 15a in the memory cell region A, and the capacitor lower electrode 14b is formed under the dielectric film 15b in the peripheral circuit region B.

Accordingly, in the memory cell region A, the first capacitors $Q_1$ each having the lower electrode 14a, the dielectric film 15a, and the upper electrode 16a are formed. Also, in the peripheral circuit region B, the second capacitor $Q_2$ having the lower electrode 14b, the dielectric film 15b, and the upper electrode 16b is formed. Since the PZT film constituting the second capacitor $Q_2$ in the peripheral circuit region B is annealed in the state that such PZT film is not covered with the protection insulating film 17, the leakage current is reduced rather than that generated before the annealing. In contrast, since the elimination of Pb from the first capacitors $Q_1$ in the memory cell region A is prevented by the protection insulating film 17 in the annealing, the saturation characteristic and the fatigue characteristic are not deteriorated.

Then, as shown in FIG. 8D, an alumina film of about 200 nm thickness is formed as a capacitor protection insulating film 21 on the first and second capacitors $Q_1$, $Q_2$ and the first interlayer insulating film 11 by the sputter. The capacitor protection insulating film 21 prevents the entering of the reducing gas into the first and second capacitors $Q_1$, $Q_2$ in later steps.

Figure 8E:
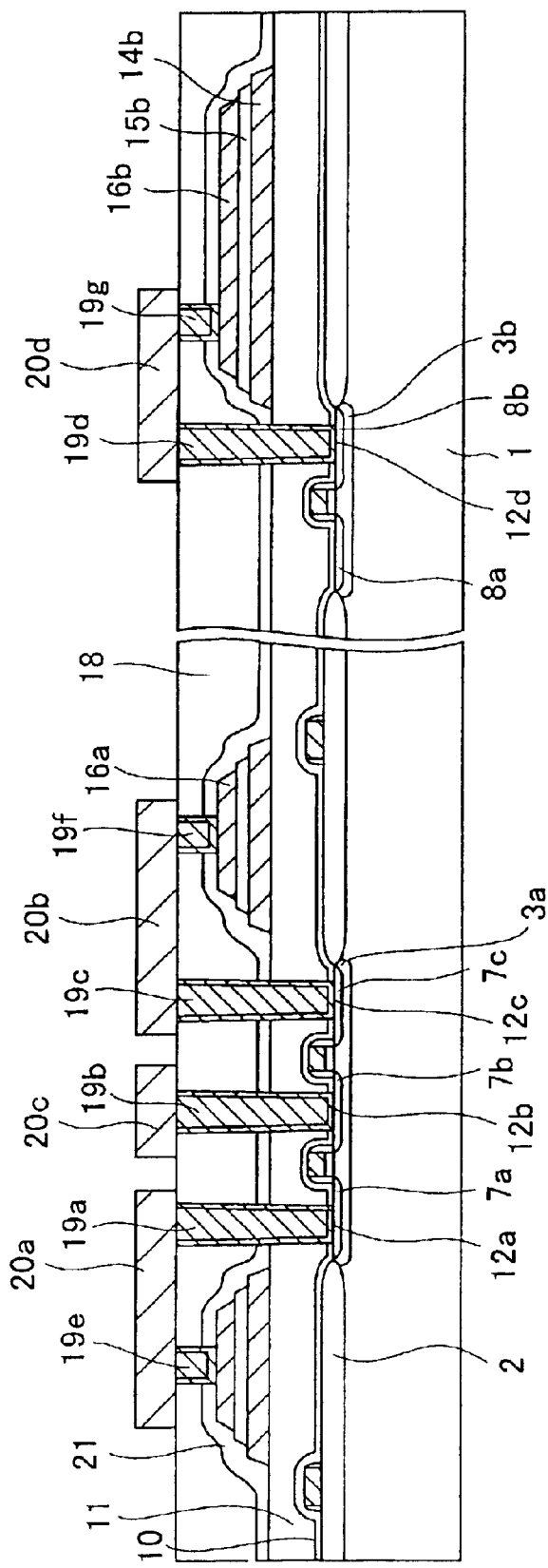

Then, as shown in FIG. 8E, the second interlayer insulating film 18 is formed on the capacitor protection insulating film 21, then the first to seventh conductive plugs 19a to 19g are formed, and then the first to third metal wirings 20a, 20b, 20d and the conductive pad 20c are formed on the second interlayer insulating film 18. These structures are formed incompliance with the steps shown in the first embodiment.

As described above, in the present embodiment, the ferroelectric film 15 in the memory cell region A is covered with the protection insulating film 17 after the first conductive film 14 and the ferroelectric film 15 are formed but before the second conductive film 16 is formed, while the ferroelectric film 15 in the peripheral circuit region B is exposed. Then, in such state, the ferroelectric film 15 in the peripheral circuit region B is annealed in the oxygen atmosphere.

Accordingly, the elimination of Pb from the ferroelectric film 15 in the memory cell region A is prevented, and the elimination of Pb from the ferroelectric film 15 in the peripheral circuit region B is accelerated.

As a result, as explained in the first embodiment, in the memory cell region A, the elimination of Pb from the first capacitor $Q_1$ is prevented and thus the deterioration of the fatigue characteristic and the saturation characteristic is prevented. Also, in the peripheral circuit region B, the elimination of Pb from the second capacitor $Q_2$ is accelerated and thus the fatigue characteristic and the saturation characteristic of the second capacitor $Q_2$ are deteriorated, but the leakage current of the second capacitor $Q_2$ is reduced small rather than the leakage current of the first capacitor $Q_1$.

(Fifth Embodiment)

The conductive plugs formed on the first to third n-type impurity diffusion regions 7a to 7c and the second p-type impurity diffusion region 8b formed on respectively may be formed at two stages. The FeRAM having such conductive plugs and steps of forming the same will be explained hereunder.

First, the first NMOS transistor $T_1$, the second nMOS transistor $T_2$, and the pMOS transistor $T_3$ are formed on the silicon substrate 1 in accordance with the steps shown in the first embodiment.

Then, as shown in FIG. 9A, the cover film 10 for covering the nMOS transistors $T_1$, $T_2$ and the pMOS transistor $T_3$ are formed on the silicon substrate 1 by the plasma CVD method. As the cover film 10, a silicon oxide nitride (SiON) film, for example, is formed.

Then, a silicon oxide ($SiO_2$) film is grown by the plasma CVD method using the TEOS gas to have a thickness of about 1.0 μm. This silicon oxide film is used as the first interlayer insulating film 11.

Then, as the densifying process of the first interlayer insulating film 11, this first interlayer insulating film 11 is annealed in the normal-pressure nitrogen atmosphere at the temperature of 700° C. for 30 minute. Then, the upper surface of the first interlayer insulating film 11 is polished by the CMP method to planarize.

Then, first to fourth contact holes 11a to 11d are formed on the first to third n-type impurity diffusion regions 7a to 7c and the second p-type impurity diffusion region 8b respectively by patterning the first interlayer insulating film 11 by virtue of the photolithography method.

Then, a titanium (Ti) film of 20 nm thickness and a titanium nitride (TiN) film of 50 nm thickness are formed sequentially as a glue film on the upper surface of the first interlayer insulating film 11 and inner surfaces of the first to fourth contact holes 11a to 11d by the sputter method. Then, a tungsten (W) film having the thickness that buries completely the contact holes 11a to 11d is grown on the glue film by the CVD method.

Then, the tungsten film and the glue film are polished sequentially by the CMP method until the upper surface of the first interlayer insulating film 11 is exposed. Accordingly, the tungsten film and the glue film left in the first to fourth contact holes 11a to 11d are used as first to fourth conductive plugs 12a to 12d respectively.

In the p-well 3a in the memory cell region A, the second conductive plug 12b being put between two gate electrodes 5a, 5b on the second n-type impurity diffusion region 7b is connected to the bit line, and the first and third conductive plugs 12a, 12c on both sides of the p-well 3a are connected to the upper electrodes of the capacitors, described later.

In this case, after the contact holes 11a to 11d are formed, the impurity may be ion-implanted into the impurity diffusion regions 7a to 7c, 8a, 8b for the contact compensation.

Then, the SiON film of about 100 nm thickness and the $SiO_2$ film of about 150 nm thickness are formed sequentially as an underlying insulating film 13 on the first interlayer insulating film 11 and the conductive plugs 12a to 12d by the CVD method. The SiON film is formed to prevent the oxidation of the conductive plugs 12a to 12d, and the $SiO_2$ film is formed to improve the crystallinity of the lower electrode of the capacitor, described later. In this case, the $SiO_2$ film constituting the underlying insulating film 13 is formed by using TEOS as the source gas.

Next, steps required until a structure shown in FIG. 9B is formed will be explained hereunder.

First, the Ti film and the Pt film are formed sequentially as the first conductive film 14 on the underlying insulating film 13. The Ti film and the Pt film are formed by the DC sputter method. In this case, a thickness of the Ti film is set to about 10 to 30 nm, and a thickness of the Pt film is set to about 100 to 300 nm. As the first conductive film 14, a conductive film made of iridium, ruthenium, ruthenium oxide, iridium oxide, strontium ruthenium oxide, or the like may be formed.

Then, the PZT film of 100 to 300 nm thickness is formed as the ferroelectric film 15 on the first conductive film 14 by the RF sputter method. As the method of forming the ferroelectric film 15, in addition to this, there are the MOD method, the MOCVD method, the sol-gel method, etc. Also, as the material of the ferroelectric film 15, in addition to the PZT, other PZT material shown in the first embodiment, the Bi layered-structure compound, and other metal oxide ferroelectric substance may be employed.

Then, as the crystallizing process of the PZT film constituting the ferroelectric film 15, RTA (Rapid Thermal Annealing) is carried out in the oxygen atmosphere at the temperature of 650 to 850° C. for 30 to 120 second. For example, the annealing is carried out at the temperature of 650° C. for 60 second.

Then, an iridium oxide film of 100 to 300 nm thickness is formed as the second conductive film 16 on the ferroelectric film 15 by the sputter method. In this case, as the second conductive film 16, platinum or strontium ruthenium oxide may be employed.

Next, steps required until a structure shown in FIG. 9C is formed will be explained hereunder.

First, the second conductive film 16 is patterned. Thus, plural capacitor upper electrodes 16a are formed in the memory cell region A, and simultaneously the capacitors upper electrode 16b is formed in the peripheral circuit region B.

Then, the ferroelectric film 15 is patterned. Thus, the stripe-like capacitor dielectric films 15a that extend in almost parallel with the word like WL are formed under a plurality of upper electrodes 16a in the memory cell region A, and the capacitor dielectric films 15b is formed under the upper electrode 16b in the peripheral circuit region B.

Then, as shown in FIG. 9D, the first conductive film 14 is patterned. Thus, the capacitor lower electrodes 14a that extend like a stripe are formed under the dielectric films 15a in the memory cell region A, and the capacitor lower electrode 14b is formed under the dielectric film 15b in the peripheral circuit region B.

Accordingly, in the memory cell region A, the first capacitors $Q_1$ each having the lower electrode 14a, the dielectric film 15a, and the upper electrode 16a are formed. Also, in the peripheral circuit region B, the second capacitor $Q_2$ having the lower electrode 14b, the dielectric film 15b, and the upper electrode 16b is formed.

The reading/writing of the information from/into the first capacitors $Q_1$ are executed based on the hysteresis characteristic of the ferroelectric film. Also, the second capacitor $Q_2$ is used to boost the voltage.

Then, as shown in FIG. 9E, the silicon oxide film (TEOS film) of about 200 nm thickness is formed as the protection insulating film 17 on the first and second capacitors $Q_1$, $Q_2$ and the underlying insulating film 13 by the CVD method using the mixed gas consisting of TEOS, helium, and oxygen, for example.

In this case, as the protection insulating film 17, in addition to the TEOS film, the silicon oxide film formed by using $SiH_4$ and $O_2$, the silicon nitride film, the silicon nitride oxide film, or the like may be applied.

Figure 9F:
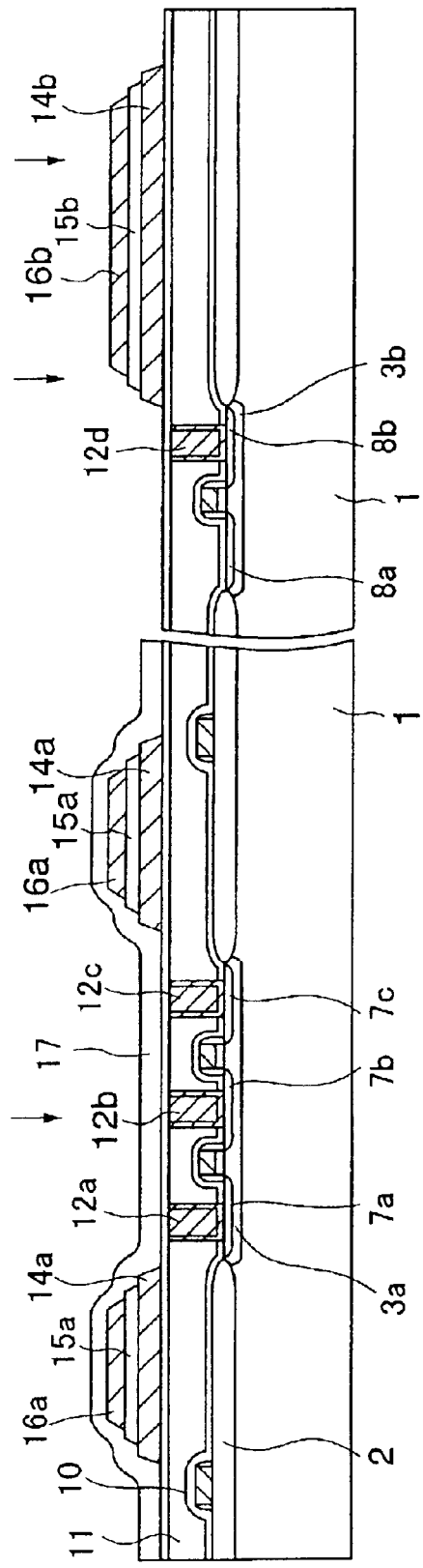

Then, as shown in FIG. 9F, the protection insulating film 17 is patterned by the photolithography method to remove from at least the upper surface of the second capacitor $Q_2$ in the peripheral circuit region B. The patterning of the protection insulating film 17 is carried out by the down-flow plasma etching by using the mixed gas of $CF_4$ and $O_2$ as the etching gas while using the resist mask (not shown).

Then, the silicon substrate 1 is put into the normal-pressure oxygen atmosphere, and the second capacitor $Q_2$ that is not covered with the protection insulating film 17 is annealed at the temperature of 650° C. for 60 minute, for example.

Accordingly, the elimination of Pb from the PZT film, for example, constituting the ferroelectric film of the second capacitor $Q_2$ in the peripheral circuit region B is accelerated. As a result, the leakage current of the second capacitor $Q_2$ is reduced rather than that generated before the annealing. In contrast, since the first capacitors $Q_1$ in the memory cell region A is covered with the protection insulating film 17, the elimination of the constitutive atoms is prevented.

In this case, the elimination of Pb may be accelerated much more by executing the annealing of the second capacitor $Q_2$ in the reduced-pressure atmosphere. Also, it is preferable that the annealing temperature of the second capacitor $Q_2$ should be set to more than 650° C. In addition, the gas introduced into the annealing atmosphere is not limited to the oxygen, and the mixed gas of the oxygen and the argon, the nitrogen gas, or the like may be employed. These conditions is similarly applied to following embodiments.

Figure 9G:
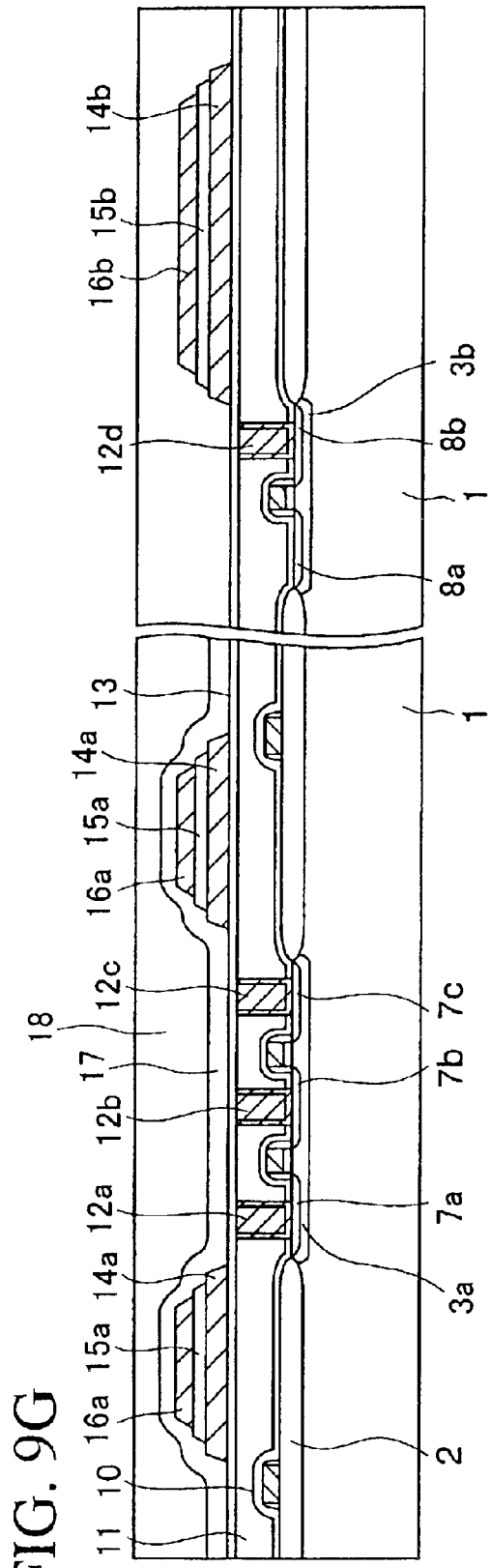

Then, as shown in FIG. 9G, the silicon oxide film of about 1 $\mu$m is formed as the second interlayer insulating film 18 on the protection insulating film 17, the underlying insulating film 13, and the second capacitor $Q_2$. This silicon oxide film is formed by the CVD method using the mixed gas consisting of TEOS, helium, and oxygen.

In this case, the second interlayer insulating film 18 may be formed by using the silane. In such case, the protection insulating film 17 in the memory cell region A prevents the reducing gas from entering into the first capacitors $Q_1$.

Then, the upper surface of the second interlayer insulating film 18 is planarized by the CMP method. In this example, a remaining film thickness of the second interlayer insulating film 18 after the CMP, when measured together with a film thickness of the protection insulating film 17, is set to about 300 nm on the capacitor in the memory cell region A.

Figure 9H:
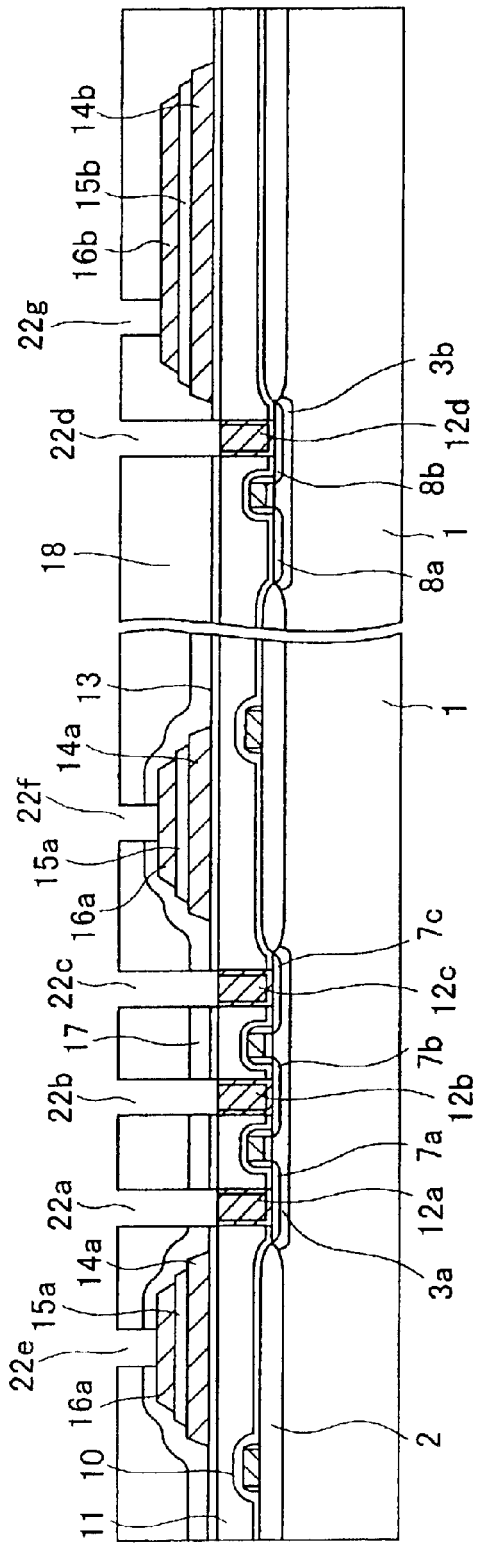

Then, as shown in FIG. 9H, fifth to eighth contact holes 22a to 22d are formed on the first to fourth conductive plugs 12a to 12d respectively by patterning the second interlayer insulating film 18, the protection insulating film 17, and the underlying insulating film 13 by virtue of the photolithography method. Also, ninth and tenth contact holes 22e, 22f are formed on the upper electrodes 15a of two first capacitors $Q_1$ over the element isolation insulating film 2 near the p-well 3a respectively. Also, an eleventh contact hole 22g is formed on the upper electrode 15b of the second capacitor $Q_2$.

Then, a TiN film of about 50 nm thickness is formed on the second interlayer insulating film 18 and in the fifth to eleventh contact holes 22a to 22g by the sputter, and then a W film is formed on the TiN film. This W film is formed to have the thickness that buries completely the fifth to eleventh contact holes 22a to 22g.

Figure 9I:
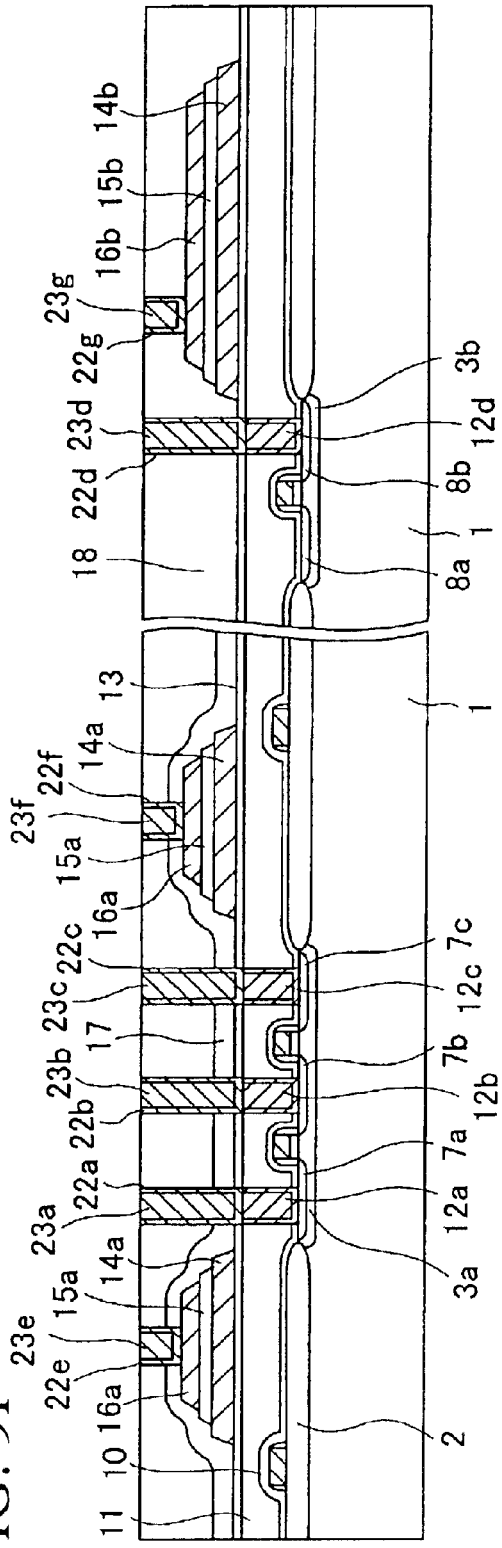

Then, as shown in FIG. 9I, the TiN film and the W film are polished by the CMP method to remove from the upper surface of the second interlayer insulating film 18. Thus, the TiN film and the W film being left in the fifth to eleventh contact holes 22a to 22g are used as fifth to eleventh conductive plug 23a to 23g respectively.

Then, the metal film having the quintuple-layered structure, which consists of the TiN film of 150 nm thickness, the Ti film of 5 nm thickness, the Al—Cu film of 500 nm thickness, the TiN film of 50 nm thickness, and the Ti film of 20 nm thickness, is formed as the wiring metal film on the second interlayer insulating film 18 and the fifth to eleventh conductive plugs 23a to 23g. Then, the wiring metal film is patterned by the photolithography method.

Figure 9J:
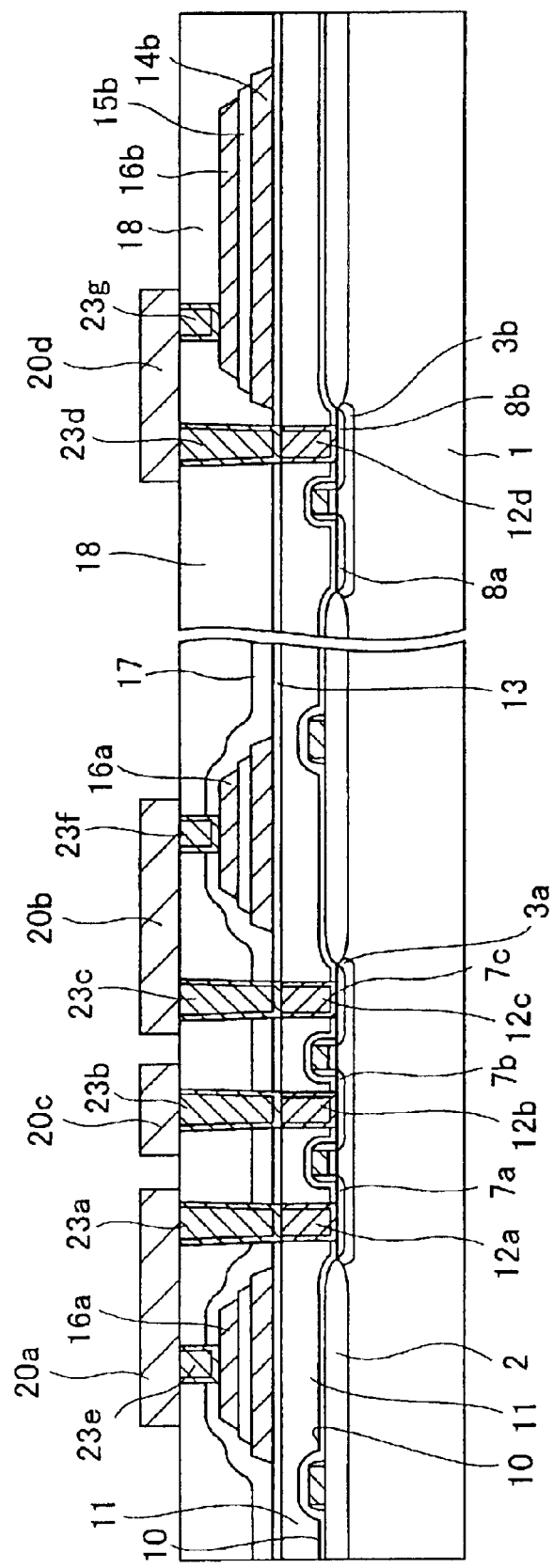

According to the patterning of this wiring metal film, as shown in FIG. 9J, the first and second metal wirings 20a, 20b and the conductive pad 20c are formed on the second interlayer insulating film 18 in the memory cell region A, while the third metal wiring 20d is formed on the second interlayer insulating film 18 in the peripheral circuit region B.

In the memory cell region A, the first metal wiring 20a is connected to the fifth conductive plug 23a on the first conductive plug 12a and the ninth conductive plug 23e on the upper electrode 16a. The second metal wiring 20b is connected to the seventh conductive plug 23c on the third conductive plug 12c and the tenth conductive plug 23f on another upper electrode 16a. Also, the conductive pad 20c is formed on the second conductive plug 23b.

In the peripheral circuit region B, the third metal wiring 20d is connected to the eingth conductive plug 23d on the fourth conductive plug 12d and the eleventh conductive plug 23g on the upper electrode 16b.

As a result, in the memory cell region A, the first n-type impurity diffusion region 7a and the upper electrode 16a of the first capacitor $Q_1$ are connected electrically to each other via the first metal wiring 20a, and the first, fifth and ninth conductive plugs 12a, 23a, 23e. Also, the third n-type impurity diffusion region 7c and the upper electrode 16a of another first capacitor $Q_1$ are connected electrically to each other via the second metal wiring 20b, and the third, seventh and tenth conductive plugs 12c, 23c, 23f. In this case, the second n-type impurity diffusion region 7b is connected electrically to the bit line (not shown), that is positioned over this region 7b, via the conductive pad 20c and the second and sixth conductive plugs 12b, 23b.

Also, in the peripheral circuit region B, the second p-type impurity diffusion region 8b is connected electrically to the upper electrode 16b of the second capacitor $Q_2$ via the third metal wiring 20d, and the fourth, eighth and eleventh conductive plugs 12d, 23d, 23g.

After the first to third 20a, 20b, 20d are formed, the third interlayer insulating film is formed, then the conductive plugs are formed, and then the bit line, etc. are formed on the third interlayer insulating film. But the explanation of their details will be omitted herein.

According to the above embodiments, in the state that the first capacitors $Q_1$ formed in the memory cell region A are covered with the protection insulating film 17, the second capacitor $Q_2$ used to boost the voltage in the peripheral circuit region B is annealed selectively. Therefore, in the second capacitor $Q_2$, the atoms serving as the leakage-current increasing factor are extracted from the ferroelectric film 15b to cause the leakage current to reduce.

Also, in the present embodiment, since the plug-to-plug structure is employed to connect the impurity diffusion regions and the metal wirings, the burying operation to constitute the conductive plugs is facilitated in contrast to above other embodiments.

In this case, even if the plug-to-plug structure is employed, the first capacitors $Q_1$ and the second capacitor $Q_2$ may be formed in compliance with the capacitor forming steps that are used similarly in the second to fourth embodiments.

(Sixth Embodiment)

Figure 10A:
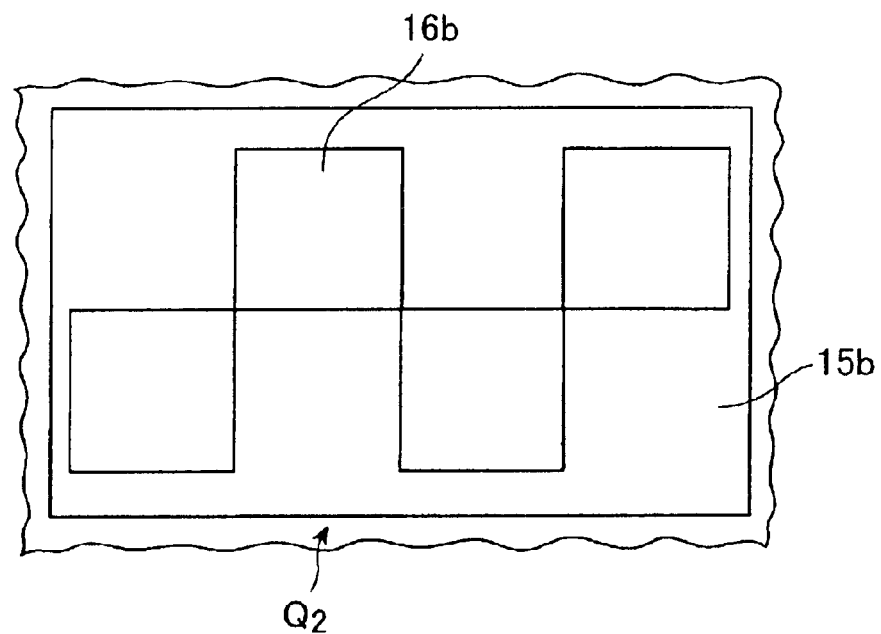
FIGS. 10A and 10B are top views showing a capacitor of a semiconductor device according to a sixth embodiment of the present invention respectively.
Figure 10B:
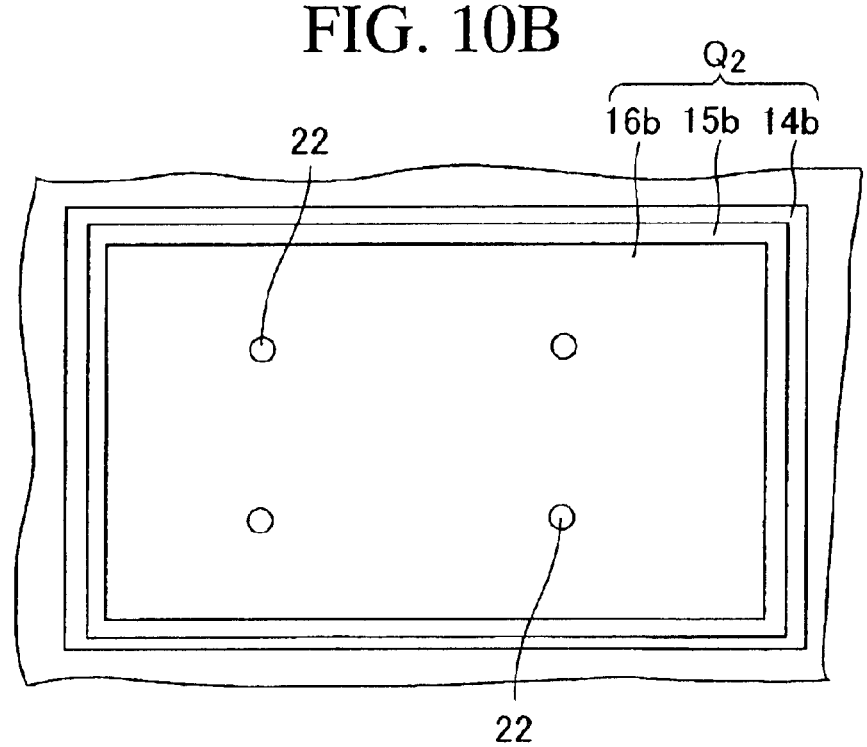

In case the planar shapes of the lower electrode 14b and the dielectric film 15b constituting the second capacitor $Q_2$ shown in the first to fifth embodiments are shaped into a quadrangular shape, the planar shape of the upper electrode 16b may be formed like a checkered shape, as shown in FIG. 10A, or a shape that has holes 22, as shown in FIG. 10B. Accordingly, a ferroelectric-substance exposing area that desorbs of predetermined element easily from the ferroelectric film 15 is formed on the upper electrode 16b.

According to this, an exposed area of the ferroelectric film 15 under the upper electrode 16b is increased, and thus Pb or Bi is readily escaped from the ferroelectric film 15 by the annealing.

In this case, the above embodiments are explained with reference to the planar capacitors. However, the above embodiments may be applied to the stacked capacitor having the structure in which the conductive plug in the first interlayer insulating film 11 is directly connected to the lower surface of the capacitor lower electrode.

As described above, according to the present invention, respective dielectric films of the first capacitor and the second capacitor, which have the different applications, are constructed by the ferroelectric material containing plural elements, and then the concentration of the predetermined element in the ferroelectric material of the ferroelectric film of the first capacitor is reduced lower than that in the ferroelectric material of the ferroelectric film of the second capacitor by the annealing. Therefore, plural types of capacitors can be formed by only one formation of the ferroelectric film in response to the applications, and the increase in semiconductor device manufacturing steps can be prevented, and the increase in cost can be suppressed.

What is claimed is:

1. A semiconductor device comprising:
    an insulating film formed over a semiconductor substrate;
    a first capacitor having a first lower electrode, a first ferroelectric film, and a first upper electrode, which are formed sequentially over the insulating film in a first region; and a second capacitor having a second lower electrode, a second ferroelectric film, and a second upper electrode, which are formed sequentially over the insulating film in a second region;

wherein the first ferroelectric film is formed of first ferroelectric material that comprises plural of elements containing a first element, the second ferroelectric film is formed of second ferroelectric material that comprises plural of elements containing the first element, and a concentration of the first element in the second ferroelectric film is lower than a concentration of the first element in the first ferroelectric film.

2. A semiconductor device according to claim 1, further comprising a protection insulating film for covering the first capacitor and exposing the second capacitor.

3. A semiconductor device according to claim 2, wherein the protection insulating film is formed on at least first upper electrode of the first capacitor.

4. A semiconductor device according to claim 2, wherein the protection insulating film is formed of any one of silicon oxide, silicon nitride, and silicon nitride oxide.

5. A semiconductor device according to claim 1, wherein the first ferroelectric material is PZT material, the second ferroelectric material is the PZT material, and the first element is lead.

6. A semiconductor device according to claim 1, wherein an area of the second capacitor is larger than an area of the first capacitor.

7. A semiconductor device according to claim 1, wherein the first region is a memory cell region, and the second region is a peripheral circuit region.

* * * * *